(12) United States Patent
Kasahara

(10) Patent No.: US 11,889,722 B2
(45) Date of Patent: *Jan. 30, 2024

(54) DISPLAY DEVICE AND ELECTRONIC APPARATUS WITH CONTACT ELECTRODE

(71) Applicant: Sony Group Corporation, Tokyo (JP)

(72) Inventor: Naoya Kasahara, Kanagawa (JP)

(73) Assignee: Sony Group Corporation, Tokyo (JP)

(*) Notice: Subject to any disclaimer, the term of this patent is extended or adjusted under 35 U.S.C. 154(b) by 113 days.

This patent is subject to a terminal disclaimer.

(21) Appl. No.: 17/542,958

(22) Filed: Dec. 6, 2021

(65) Prior Publication Data

US 2022/0190076 A1 Jun. 16, 2022

Related U.S. Application Data

(63) Continuation of application No. 16/634,348, filed as application No. PCT/JP2018/025223 on Jul. 3, 2018, now Pat. No. 11,211,440.

(30) Foreign Application Priority Data

Aug. 2, 2017 (JP) ................................ 2017-149631

(51) Int. Cl.
*H01L 29/08* (2006.01)
*H10K 59/124* (2023.01)
*H10K 50/125* (2023.01)
*H10K 50/824* (2023.01)

(52) U.S. Cl.
CPC ......... *H10K 59/124* (2023.02); *H10K 50/125* (2023.02); *H10K 50/824* (2023.02)

(58) Field of Classification Search
CPC ... H10K 59/124; H10K 50/125; H10K 50/824

USPC .......................................................... 257/40
See application file for complete search history.

(56) References Cited

U.S. PATENT DOCUMENTS

| 11,211,440 B2* | 12/2021 | Kasahara | H10K 59/124 |
| 2001/0000005 A1* | 3/2001 | Forrest | C09K 11/06 |
| | | | 257/E33.056 |
| 2011/0074749 A1* | 3/2011 | Higashi | H10K 59/131 |
| | | | 345/206 |
| 2011/0127906 A1* | 6/2011 | Mitsuya | H10K 85/6572 |
| | | | 313/504 |
| 2012/0056537 A1 | 3/2012 | Koyama | |

(Continued)

FOREIGN PATENT DOCUMENTS

| CN | 101419776 A | 4/2009 |
| CN | 102082151 A | 6/2011 |

(Continued)

*Primary Examiner* — Phuc T Dang
(74) *Attorney, Agent, or Firm* — Michael Best & Friedrich LLP

(57) ABSTRACT

A display device of the present disclosure includes: an organic EL layer deposited on a circuit unit formed on a substrate via an insulating film; a cathode electrode deposited on the organic EL layer; a groove formed along a direction of arrangement of pixels between the pixels in the insulating film; and a contact electrode that is provided at a bottom of the groove and receives a predetermined potential. Moreover, the cathode electrode is electrically connected to the contact electrode in the groove.

5 Claims, 18 Drawing Sheets

(56) References Cited

U.S. PATENT DOCUMENTS

| | | | |
|---|---|---|---|
| 2013/0267046 A1* | 10/2013 | Or-Bach | H01L 27/0688 |
| | | | 257/E21.214 |
| 2013/0341607 A1 | 12/2013 | Heo et al. | |
| 2014/0197394 A1 | 7/2014 | Otsuka et al. | |
| 2014/0284785 A1 | 9/2014 | Sung | |
| 2015/0311318 A1 | 10/2015 | Kim | |
| 2016/0043341 A1 | 2/2016 | Heo | |
| 2016/0149155 A1 | 5/2016 | Kim | |
| 2016/0284785 A1* | 9/2016 | Matsuura | H10K 50/824 |
| 2017/0077456 A1 | 3/2017 | Chung | |

FOREIGN PATENT DOCUMENTS

| | | |
|---|---|---|
| JP | 2005-038651 A | 2/2005 |
| JP | 2009-109521 A | 5/2009 |
| JP | 2010-020971 A | 1/2010 |
| JP | 2012-078798 A | 4/2012 |
| JP | 2012-129197 A | 7/2012 |
| JP | 2014-199739 A | 10/2014 |

* cited by examiner

DISPLAY DEVICE AND ELECTRONIC APPARATUS WITH CONTACT ELECTRODE

CROSS REFERENCE TO RELATED APPLICATIONS

This application is a continuation of U.S. application Ser. No. 16/634,348, now U.S. Pat. No. 11,211,440, filed Jan. 27, 2020, which is a U.S. Nationalization stage entry of International Application No. PCT/JP2018/025223, filed Jul. 3, 2018, which claims the benefit of Japanese Priority Patent Application No. JP2017-149631 filed with the Japan Patent Office on Aug. 2, 2017, the entire contents of which are incorporated herein by reference.

TECHNICAL FIELD

The present disclosure relates to a display device, a method of manufacturing the display device, and an electronic apparatus.

BACKGROUND ART

Display devices that have been mainstream in recent years are flat (flat panel) display devices. As one of the flat display devices, there is a display device using, as a light-emitting unit (light-emitting element) of a pixel, a so-called current-driven electro-optical element whose luminescence intensity changes depending on the value of a current flowing through a device. As the current-driven electro-optical element, there is known an organic electroluminescence (EL) element employing a phenomenon in which electroluminescence of an organic material is used to obtain light emission when an electric field is applied to an organic thin film.

An organic EL display device using the organic EL element as the light-emitting unit of the pixel typically has a configuration in which a circuit unit for driving the organic EL element is formed on a substrate, an insulating film (interlayer film) is provided to cover the circuit unit, and the organic EL element is arranged on the insulating film. Then, a cathode electrode as an upper electrode is deposited on the organic EL element as an electrode common to all pixels. Since a predetermined potential needs to be applied to the cathode electrode, a contact electrode to which a predetermined potential is applied is provided on an outer periphery of a light-emitting pixel area, and the cathode electrode is electrically connected to the contact electrode.

A conventional configuration for electrically connecting the cathode electrode to the circuit unit is that the contact electrode electrically connected to the circuit unit is provided on the outer periphery of the light-emitting pixel area (display area) so that the cathode electrode is electrically connected to the circuit unit at the contact electrode (for example, see Patent Document 1). In this configuration, the cathode electrode is vacuum-deposited on the contact electrode provided on the outer periphery of the light-emitting pixel area using a deposition mask.

CITATION LIST

Patent Document

Patent Document 1: Japanese Patent Application Laid-Open No. 2014-199739

SUMMARY OF THE INVENTION

Problems to be Solved by the Invention

In the case where the cathode electrode is vacuum-deposited on the contact electrode using the deposition mask as described above, a base substrate on which the circuit unit is formed and the deposition mask are misaligned in some cases by the influence of alignment accuracy between the base substrate and the deposition mask, warpage of the substrate, and the like. Therefore, in anticipation of the alignment accuracy between the base substrate and the deposition mask, the warpage of the substrate, and the like, the contact electrode needs to be designed in size that secures an area allowing the contact electrode and the cathode electrode to have a sufficiently low contact resistance. For such a reason, the configuration in which the contact electrode is provided on the outer periphery of the light-emitting pixel area to electrically connect the cathode electrode and the circuit unit at the contact electrode becomes a cause of hindering narrowing of the frame of a display panel.

Accordingly, an object of the present disclosure is to provide a display device capable of applying a predetermined potential to a cathode electrode via a contact electrode while narrowing a frame of a display panel, a method of manufacturing the display device, and an electronic apparatus having the display device.

Solutions to Problems

In order to achieve the above object, a display device of the present disclosure includes:
an organic EL layer deposited on a circuit unit formed on a substrate via an insulating film;
a cathode electrode deposited on the organic EL layer;
a groove formed along a direction of arrangement of pixels between the pixels in the insulating film; and
a contact electrode that is provided at a bottom of the groove and receives a predetermined potential, in which
the cathode electrode is electrically connected to the contact electrode in the groove. Moreover, in order to achieve the above object, an electronic apparatus of the present disclosure includes the display device having the above configuration.

Furthermore, in order to achieve the above object, a method of manufacturing a display device of the present disclosure, in manufacturing the display device including
an organic EL layer deposited on a circuit unit formed on a substrate via an insulating film, and
a cathode electrode deposited on the organic EL layer, includes:
forming a groove along a direction of arrangement of pixels between the pixels in the insulating film, and providing a contact electrode that receives a predetermined potential at a bottom of the groove; and
electrically connecting the cathode electrode to the contact electrode in the groove.

The groove is formed along the direction of arrangement of the pixels between the pixels in the insulating film, and the cathode electrode is electrically connected to the contact electrode provided at the bottom of the groove in the groove, whereby a panel structure with a predetermined potential applied to the cathode electrode in a light-emitting pixel area can be obtained.

Effects of the Invention

According to the present disclosure, the cathode electrode can be electrically connected to the contact electrode in the light-emitting pixel area, so that the contact electrode need not be provided on the outer periphery of the light-emitting pixel area and that the frame of the display panel can be narrowed accordingly, while at the same time the predetermined potential can be applied to the cathode electrode via the contact electrode. Note that the present disclosure has an effect not necessarily limited to the one described herein, but may have any effect described in the present specification. Moreover, the effect described in the present specification is provided by way of example only and not by way of limitation, where an additional effect may be obtained as well.

MODE FOR CARRYING OUT THE INVENTION

Figure 1:
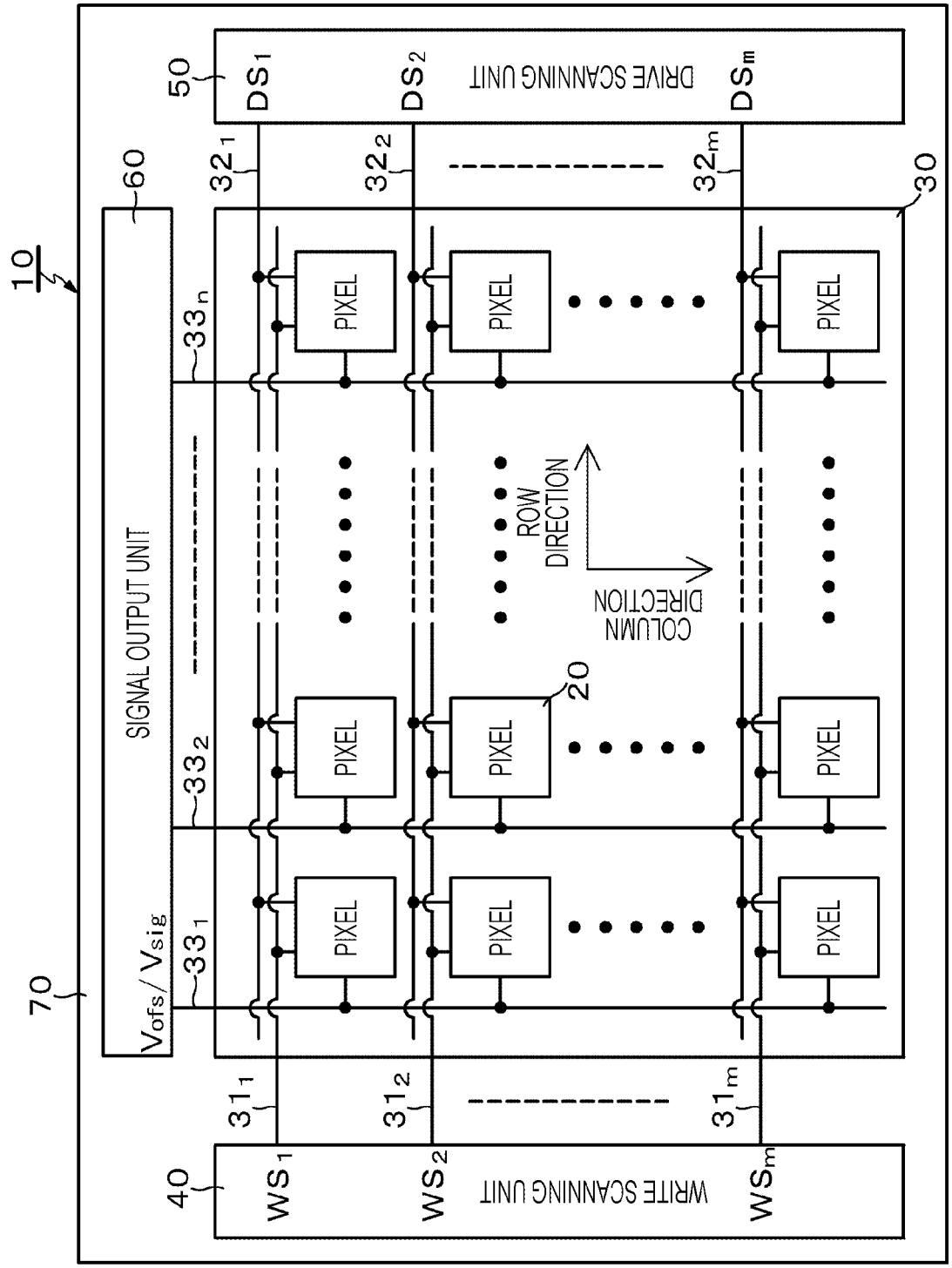
FIG. 1 is a system configuration diagram illustrating an overview of a configuration of an active matrix organic EL display device of the present disclosure.

Hereinafter, modes for carrying out the technology of the present disclosure (hereinafter referred to as "embodiments") will be described in detail with reference to the drawings. The technology of the present disclosure is not limited to the embodiments, and various numerical values, materials, and the like in the embodiments are examples. In the following description, the same reference numeral is used for the same element or an element having the same function so that redundant description will be omitted. Note that the description will be made in the following order.

1. General description regarding display device, method of manufacturing the same, and electronic apparatus of present disclosure
2. Display device of present disclosure
    2-1. System configuration
    2-2. Pixel circuit
    2-3. Panel structure according to conventional example
3. Description of embodiments
    3-1. First example
    3-2. Second example
    3-3. Third example
    3-4. Fourth example
    3-5. Fifth example
4. Variation
5. Electronic apparatus of present disclosure
    5-1. First specific example (example of digital still camera)
    5-2. Second specific example (example of head mounted display)
6. Configuration that can be adopted by present disclosure

General Description Regarding Display Device, Method of Manufacturing the Same, and Electronic Apparatus of Present Disclosure A display device, a method of manufacturing the display device, and an electronic apparatus of the present disclosure can adopt a configuration in which an auxiliary electrode electrically connecting a cathode electrode and a contact electrode is provided on a side wall of a groove.

The display device, the method of manufacturing the display device, and the electronic apparatus of the present disclosure including the preferable configuration described above can adopt a configuration in which the contact electrode receives an equal potential across an entire light-emitting pixel area. Alternatively, the light-emitting pixel area can be divided into a plurality of areas while at the same time electrically isolating the contact electrode for each of the plurality of areas, so that a potential different for each area is applied to the contact electrode in each of the plurality of areas.

Furthermore, the display device, the method of manufacturing the display device, and the electronic apparatus of the present disclosure including the preferable configuration described above can adopt a configuration in which an organic EL layer is formed pixel by pixel with monochromatic light-emitting organic EL materials for a plurality of colors. Alternatively, the organic EL layer can be formed in common for all pixels using a white light-emitting organic EL material so that white light emitted from the organic EL layer is dispersed by a color filter having an optical spectrum for a plurality of colors.

Furthermore, the display device, the method of manufacturing the display device, and the electronic apparatus of the present disclosure including the preferable configuration described above can adopt a configuration in which a drive circuit unit for a light-emitting unit including the organic EL layer is formed on a semiconductor substrate.

Display Device of Present Disclosure

The display device of the present disclosure is a so-called active matrix display device that drives the light-emitting unit (light-emitting element) using a thin film transistor (TFT) formed on a transparent insulating substrate or a metal oxide semiconductor (MOS) transistor formed on a silicon semiconductor substrate and causes the light-emitting unit to emit light.

As the light-emitting unit, there is a current-driven electro-optical element whose luminescence intensity changes depending on the value of a current flowing through a device. The current-driven electro-optical element includes an organic EL element, for example. Here, an active matrix organic EL display device that uses the organic EL element being the current-driven electro-optical element as the light-emitting unit of a pixel circuit will be described as an example. Hereinafter, the "pixel circuit" will be simply referred to as a "pixel" in some cases.

A typical mode of the organic EL display device is to control a current flowing through the organic EL element by a thin film transistor formed on a transparent insulating substrate such as a glass substrate. In addition, for applications such as television system and smartphone displays, for example, amorphous silicon or polycrystalline silicon is typically used as a channel material for the thin film transistor. On the other hand, in a case of a high-definition and small display device having a pixel pitch of 10 μm or less, for example, and resolution exceeding 2500 pixels per inch [ppi], for example, a MOS transistor formed on a semiconductor substrate such as a silicon substrate is used in some cases to control the current flowing through the organic EL element.

The organic EL display device causes the organic EL element to emit light by fixing a common electrode provided in common for all pixels at 0 V, for example, and applying a positive voltage to an individual electrode positioned on an opposite side of the common electrode across an organic EL layer and provided for each pixel. Hereinafter, the individual electrode provided for each pixel is referred to as an anode electrode, and the common electrode provided in common for all the pixels is referred to as a cathode electrode.

As described above, a typical example of the usage of the cathode electrode is to fix the potential thereof (cathode potential) at 0 V, but the cathode electrode is not limited to this usage and can be used by, for example, setting the cathode potential to a negative potential and setting a difference in potential from the anode electrode larger than a case where the cathode potential is fixed at 0 V to increase the luminance. An embodiment described below is based on, but not limited to, the usage where the cathode potential is fixed at 0 V.

System Configuration

FIG. 1 is a system configuration diagram illustrating an overview of a configuration of the active matrix organic EL display device of the present disclosure. As illustrated in FIG. 1, an organic EL display device 10 of the present disclosure includes a pixel array unit 30 in which a plurality of pixels 20 including the organic EL element is two-dimensionally arranged in a matrix form, and a peripheral circuit (peripheral drive unit) arranged around the pixel array unit 30.

The peripheral circuit includes, for example, a write scanning unit 40, a drive scanning unit 50, a signal output unit 60, and the like mounted on a display panel 70 on which the pixel array unit 30 is mounted, and drives each pixel 20 of the pixel array unit 30. Note that it is also possible to adopt a configuration in which some or all of the write scanning unit 40, the drive scanning unit 50, and the signal output unit 60 are provided outside the display panel 70.

The display panel 70 can use, as a substrate thereof, a transparent insulating substrate such as a glass substrate or a semiconductor substrate such as a silicon substrate. An organic EL display device using the semiconductor substrate as the substrate of the display panel 70 is referred to as a so-called micro display (small display), and is suitable for use as an electronic viewfinder of a digital still camera, a display unit of a head mounted display, and the like.

The organic EL display device 10 can be configured to support monochrome (black and white) display or can be configured to support color display. In a case where the organic EL display device 10 supports color display, one pixel (unit pixel) to be a unit for forming a color image includes a plurality of sub-pixels. At this time, each of the sub-pixels corresponds to the pixel 20 in FIG. 1. More specifically, in a display device supporting color display, one pixel includes three sub-pixels being a sub-pixel that emits red (R) light, a sub-pixel that emits green (G) light, and a sub-pixel that emits blue (B) light, for example.

However, one pixel is not limited to a combination of the sub-pixels of three primary colors R, G, and B, but can be configured by adding sub-pixels of one or a plurality of colors to the sub-pixels of the three primary colors. More specifically, for example, one pixel can be configured by adding a sub-pixel that emits white (W) light to improve luminance, or by adding at least one sub-pixel that emits light of a complementary color to expand the color reproduction range.

The pixel array unit 30 includes a scan line 31 ($31_1$ to $31_m$) and a drive line 32 ($32_1$ to $32_m$) wired for each pixel row along a row direction (direction of arrangement of pixels in the pixel row/horizontal direction) with respect to the array of the pixels 20 in "m" rows and "n" columns. Moreover, a signal line 33 ($33_1$ to $33_n$) is wired for each pixel column along a column direction (direction of arrangement of pixels in the pixel column/vertical direction) with respect to the array of the pixels 20 in "m" rows and "n" columns.

The scan lines $31_1$ to $31_m$ are each connected to an output end of a corresponding row of the write scanning unit 40. The drive lines $32_1$ to $32_m$ are each connected to an output end of a corresponding row of the drive scanning unit 50. The signal lines $33_1$ to $33_n$ are each connected to an output end of a corresponding column of the signal output unit 60.

The write scanning unit 40 includes a shift register circuit and the like. In writing a signal voltage of a video signal to each pixel 20 of the pixel array unit 30, the write scanning unit 40 performs so-called line sequential scanning that sequentially scans each pixel 20 of the pixel array unit 30 row by row by sequentially supplying write scanning signals WS ($WS_1$ to $WS_m$) to the scan lines 31 ($31_1$ to $31_m$).

The drive scanning unit 50 includes a shift register circuit and the like as with the write scanning unit 40. The drive scanning unit 50 supplies light emission control signals DS ($DS_1$ to $DS_m$) to the drive lines 32 ($32_1$ to $32_m$) in synchronization with the line sequential scanning by the write scanning unit 40, thereby controlling light emission/non-light emission (extinction) of the pixels 20.

The signal output unit 60 selectively outputs a signal voltage $V_{sig}$ of a video signal (hereinafter simply referred to as a "signal voltage" in some cases) corresponding to luminance information supplied from a signal supply source (not shown), and a reference voltage $V_{ofs}$. Here, the reference voltage $V_{ofs}$ is a voltage corresponding to a voltage serving as a reference for the signal voltage $V_{sig}$ of the video signal (for example, a voltage corresponding to the black level of the video signal) or a voltage in the vicinity thereof. The reference voltage $V_{ofs}$ is used as an initialization voltage when a correction operation is performed.

The signal voltage $V_{sig}$/reference voltage $V_{ofs}$ alternatively output from the signal output unit 60 is written, through the signal lines 34 ($34_1$ to $34_n$), into each pixel 20 of the pixel array unit 30 by the pixel row selected by the line sequential scanning of the write scanning unit 40. That is, the signal output unit 60 adopts a line sequential writing drive mode in which the signal voltage $V_{sig}$ is written by the pixel row (line).

Pixel Circuit

Figure 2:
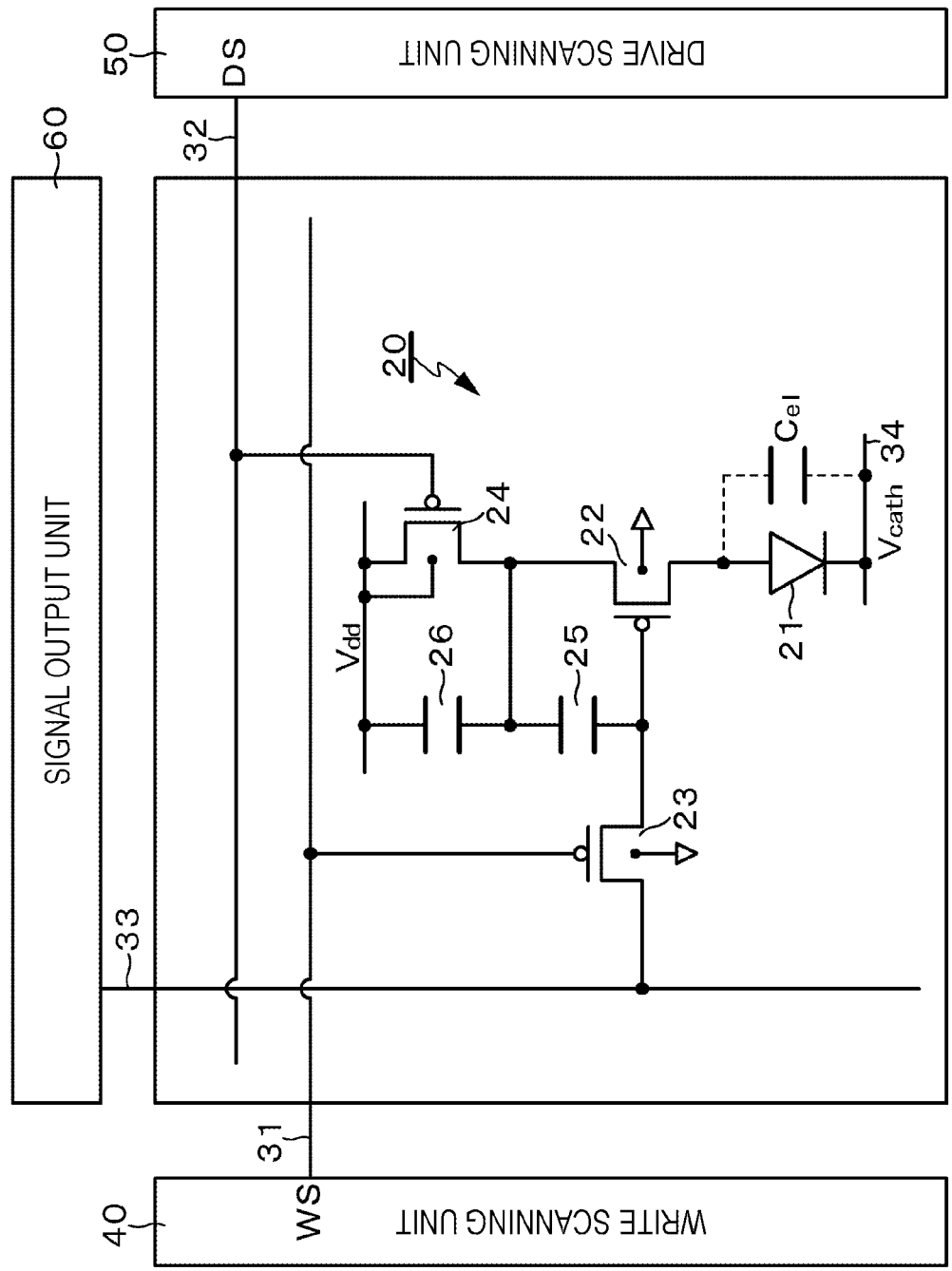
FIG. 2 is a circuit diagram illustrating an example of a circuit configuration of a pixel (pixel circuit) in the active matrix organic EL display device of the present disclosure.

FIG. 2 is a circuit diagram illustrating an example of a circuit configuration of the pixel (pixel circuit) in the active matrix organic EL display device 10 of the present disclosure. A light-emitting unit of the pixel 20 includes an organic EL element 21. The organic EL element 21 is an example of the current-driven electro-optical element whose luminescence intensity changes depending on the value of a current flowing through a device.

As illustrated in FIG. 2, the pixel 20 includes the organic EL element 21 and a drive circuit unit (pixel drive circuit unit) that drives the organic EL element 21 by passing a current through the organic EL element 21. The organic EL element 21 has a cathode electrode connected to a common power line 34 wired in common to all the pixels 20. As a result, a predetermined potential is applied as a cathode potential $V_{cath}$ to the cathode electrode of the organic EL element 21 through the common power line 34. In the figure, "$C_{el}$" indicates an equivalent capacitor for the organic EL element 21.

The drive circuit unit that drives the organic EL element 21 includes a drive transistor 22, a sampling transistor 23, a light emission control transistor 24, a holding capacitor 25, and an auxiliary capacitor 26. Here, the organic EL element 21 and the drive circuit unit thereof are assumed to be formed on a semiconductor substrate such as a silicon substrate, not on a transparent insulating substrate such as a glass substrate, and a P-channel transistor is used as the drive transistor 22.

Furthermore, in the present example, a P-channel transistor is also used for each of the sampling transistor 23 and the light emission control transistor 24 as with the drive transistor 22. Therefore, the drive transistor 22, the sampling transistor 23, and the light emission control transistor 24 have four terminals being the source, gate, drain, and back gate instead of three terminals being the source, gate, and drain. A power supply voltage $V_{dd}$ is applied to the back gate.

However, the sampling transistor 23 and the light emission control transistor 24 are switching transistors functioning as switching elements, and are not limited to the P-channel transistors. The sampling transistor 23 and the light emission control transistor 24 may thus be N-channel transistors or ones in which a P-channel type and an N-channel type are mixed.

In the pixel 20 configured as described above, the sampling transistor 23 samples the signal voltage $V_{sig}$ supplied from the signal output unit 60 through the signal line 33, and writes the signal voltage to the holding capacitor 25. The light emission control transistor 24 is connected between a node of the power supply voltage $V_{dd}$ and a source electrode of the drive transistor 22, and controls light emission/non-light emission of the organic EL element 21 while driven by the light emission control signal DS.

The holding capacitor 25 is connected between a gate electrode and the source electrode of the drive transistor 22. The holding capacitor 25 holds the signal voltage $V_{sig}$ written by the sampling by the sampling transistor 23. The drive transistor 22 drives the organic EL element 21 by passing a driving current corresponding to the voltage held by the holding capacitor 25 to the organic EL element 21.

The auxiliary capacitor 26 is connected between the source electrode of the drive transistor 22 and a node of a fixed potential, for example, a node of the power supply voltage $V_{dd}$. The auxiliary capacitor 26 has a function of suppressing a fluctuation of a source potential of the drive transistor 22 when the signal voltage $V_{sig}$ is written and setting a gate-source voltage $V_{gs}$ of the drive transistor 22 to a threshold voltage $V_{th}$ of the drive transistor 22.

Panel Structure According to Conventional Example

Figure 3A:
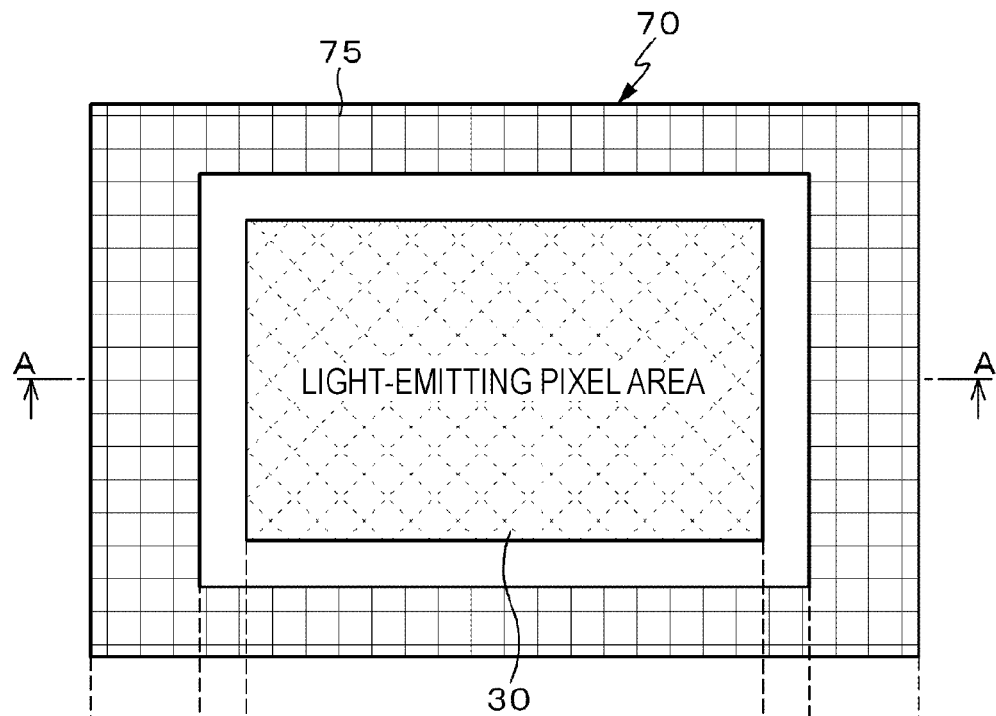
FIG. 3A is a plan view illustrating a planar structure of a display panel 70 according to a conventional example.
Figure 3B:
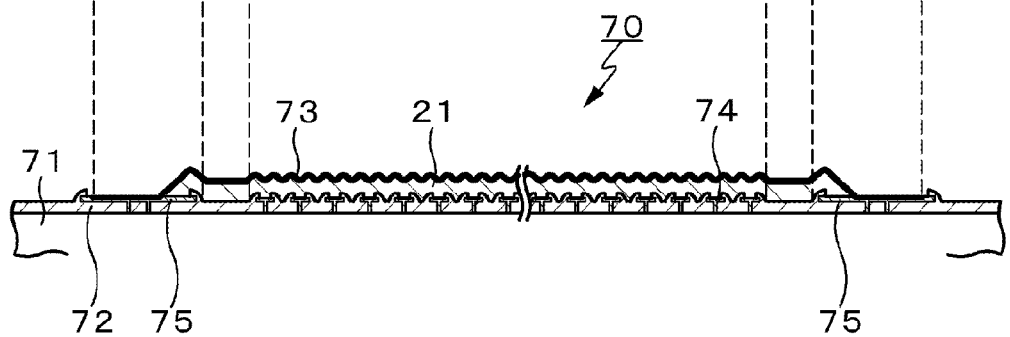
FIG. 3B is a cross-sectional view taken along line A-A of FIG. 3A.

Here, a structure (panel structure) of the display panel 70 according to a conventional example will be described. FIG. 3A illustrates a plan view of the structure of the display panel 70 according to the conventional example, and FIG. 3B illustrates a cross-sectional view taken along line A-A of FIG. 3A.

The display panel 70 has a configuration in which a circuit unit (not shown) for driving the organic EL element 21 is formed on a semiconductor substrate 71 such as a silicon substrate, an interlayer film 72 that is an insulating film is deposited while covering the circuit unit, and the organic EL element 21 is arranged on the interlayer film 72. Then, a cathode electrode 73 as an upper electrode is deposited on the organic EL element 21 as an electrode common to all the pixels. Moreover, the organic EL element 21 is provided with an anode electrode 74 as a lower electrode for each pixel. As is apparent from FIG. 2, the anode electrode 74 is electrically connected to the circuit unit for driving the organic EL element 21 pixel by pixel.

A predetermined potential needs to be applied to the cathode electrode 73 as the cathode potential $V_{cath}$. Specifically, in a case where the configuration of the pixel circuit of FIG. 2 is adopted, for example, the cathode electrode 73 needs to be electrically connected to the common power line 34 having the cathode potential $V_{cath}$. Therefore, in the panel structure of the display panel 70 according to the conventional example, a contact electrode 75 to which a predetermined potential is applied as the cathode potential $V_{cath}$ is provided in a rectangular ring shape on the outer periphery of a light-emitting pixel area being the area of the pixel array unit 30, so that the cathode electrode 73 is electrically connected to the contact electrode 75.

Here, the cathode electrode 73 is vacuum-deposited on the contact electrode 75 lying on the outer periphery of the light-emitting pixel area using a deposition mask. In this case, the semiconductor substrate 71 and the deposition mask are misaligned in some cases by the influence of alignment accuracy between a base substrate on which the circuit unit is formed, that is, the semiconductor substrate 71, and the deposition mask, warpage of the semiconductor substrate 71, and the like. Therefore, in anticipation of the alignment accuracy between the semiconductor substrate 71 and the deposition mask, the warpage of the substrate, and the like, the contact electrode 75 needs to be designed in size that secures an area allowing the contact electrode 75 and the cathode electrode 73 to have a sufficiently low contact resistance.

Depending on the area of the light-emitting pixel area (area of the pixel array unit 30) and the material of the contact electrode 75, the contact electrode 75 needs to have the width of about 1 mm in some cases for a display panel with the light-emitting pixel area of 0.5 inches or less, for example. The size of the contact electrode 75 does not change greatly even if the area of the light-emitting pixel area decreases as the pixels become finer (have higher definition) and chip becomes smaller, so that a relative ratio of the width of the contact electrode 75 occupying the panel size increases, which hinders narrowing of a frame of the display panel.

Figure 4:
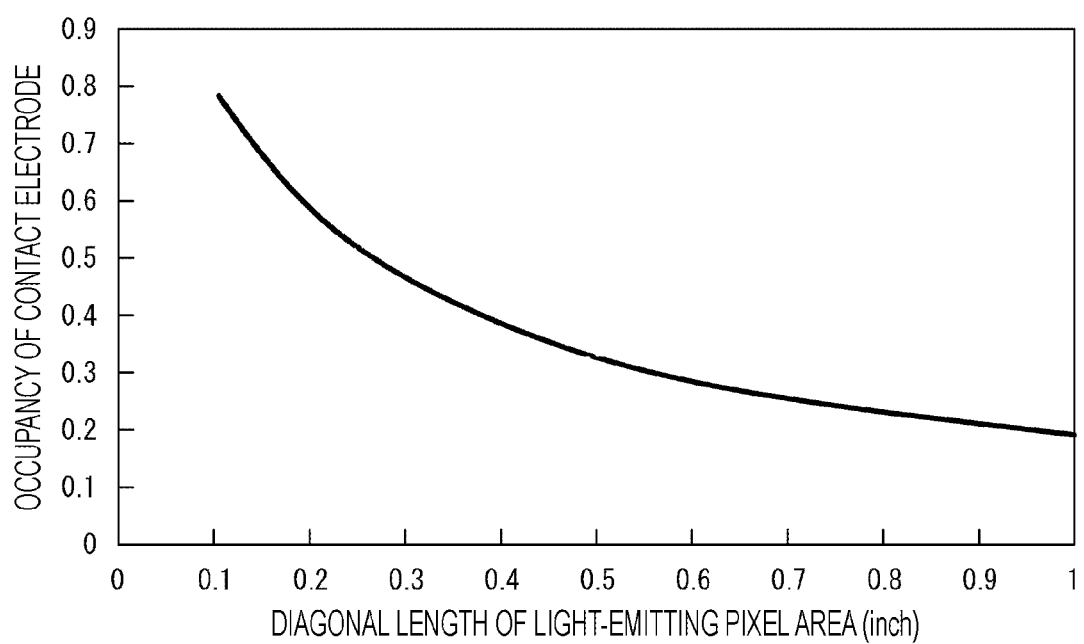
FIG. 4 is a graph illustrating a relationship between a diagonal length of a light-emitting pixel area and occupancy of a contact electrode.

FIG. 4 illustrates a relationship between a diagonal length of the light-emitting pixel area and occupancy of the contact electrode 75. Here, as an example, the shape of the light-emitting pixel area in plan view is assumed to be a square, and the diagonal length of the light-emitting pixel area is taken on the horizontal axis while the occupancy of the contact electrode 75 when the width thereof is assumed to be 1 mm is taken on the vertical axis. The occupancy of the contact electrode 75 is a ratio of the area of the contact electrode 75 to the area of the light-emitting pixel area plus the area of the contact electrode 75.

As is apparent from FIG. 4, the ratio of the area of the contact electrode 75 is close to 50% when the diagonal length of the light-emitting pixel area is 0.5 inches or less. That is, if the area of the contact electrode 75 on the outer periphery of the light-emitting pixel area can be reduced, the chip size can be reduced by about 50%, and the cost can be reduced accordingly.

Description of Embodiment

Now, the organic EL display device 10 according to the present embodiment has a panel structure in which a groove is formed along the direction of arrangement of pixels between the pixels in the insulating film (interlayer film 72) on which the organic EL element 21 is arranged, and the contact electrode 75 to which a predetermined potential is applied is provided at a bottom of the groove. In addition, in this panel structure, the cathode electrode 73 is electrically connected to the contact electrode 75 in the groove. As a result, a predetermined potential is applied as the cathode potential $V_{cath}$ to the cathode electrode 73 of the organic EL element 21 through the contact electrode 75 in the groove.

According to the panel structure of the organic EL display device 10 of the present embodiment, the cathode electrode 73 can be electrically connected to the contact electrode 75 in the light-emitting pixel area, so that the contact electrode 75 need not be provided on the outer periphery of the light-emitting pixel area and that the frame of the display panel 70 can be narrowed accordingly. As a result, in the case of the example of FIG. 4, the chip size can be reduced by about 50%, and a reduction in cost (cost reduction) can be achieved accordingly. Hereinafter, specific examples of the present embodiment will be described.

First Example

Figure 5:
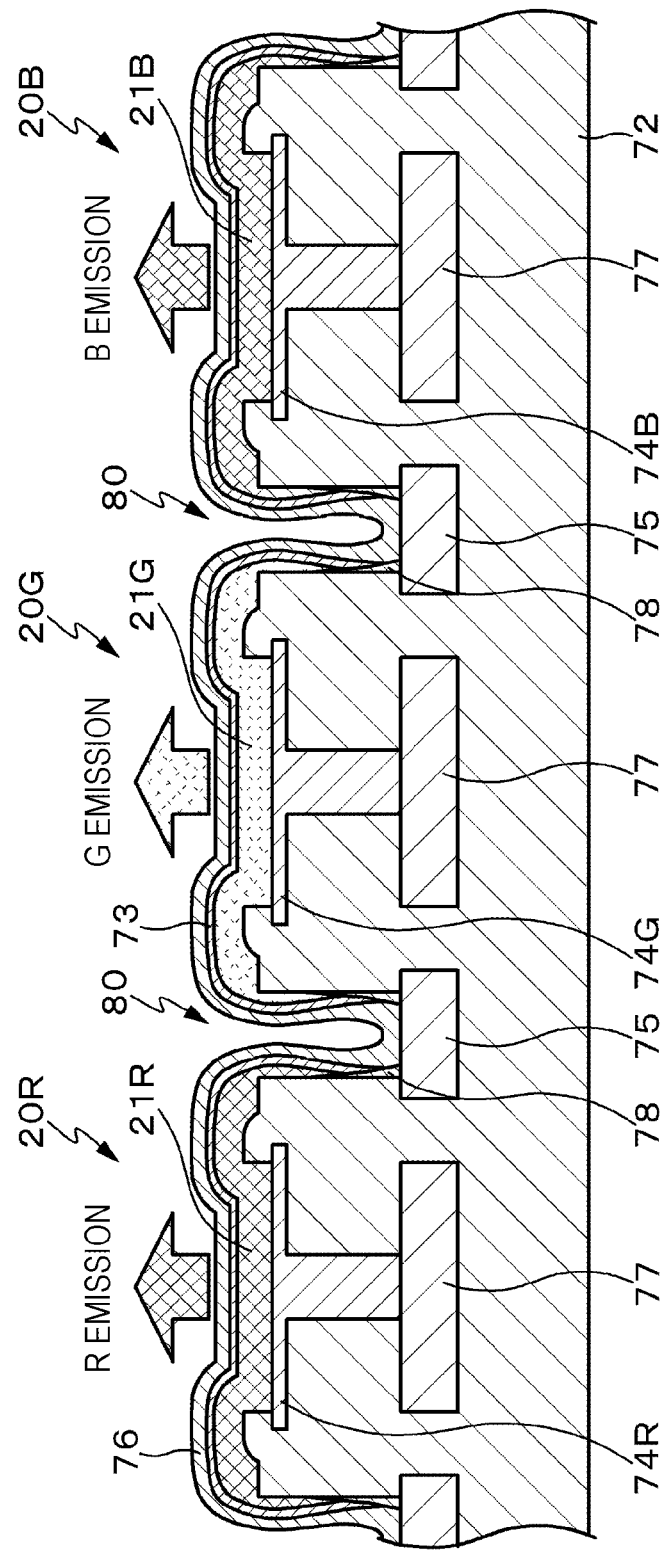
FIG. 5 is a cross-sectional end view illustrating a cross-sectional structure of a main part of a panel structure according to a first example.

A first example is an example in which an organic EL layer is formed using monochromatic light-emitting organic EL materials for R, G, B, and the like in the panel structure of the organic EL display device 10 according to the present embodiment. FIG. 5 is a cross-sectional end view illustrating a cross-sectional structure of a main part of the panel structure according to the first example. Here, the figure illustrates the cross-sectional structure of three pixels (sub-pixels) 20R, 20G, and 20B corresponding to R, G, and B arranged adjacent to one another.

On the semiconductor substrate (see FIG. 3B) on which the circuit unit for driving the organic EL element 21 is formed, the interlayer film 72 being the insulating film is formed so as to cover the circuit unit, and the pixels 20R, 20G, and 20B corresponding to the three colors R, G, and B are arranged adjacent to one another on the interlayer film 72.

Organic EL elements (organic EL layers) 21R, 21G, and 21B of the corresponding pixels 20R, 20G, and 20B are formed by vacuum deposition of the organic EL materials. For the organic EL elements 21R, 21G, and 21B, anode electrodes 74R, 74G, and 74B as lower electrodes are provided on the interlayer film 72 independently for each pixel. The anode electrodes 74R, 74G, and 74B are each electrically connected to a wiring 77 of the circuit unit that drives the organic EL element 21, or the wiring 77 connected to the source electrode of the drive transistor in the case of the circuit example of FIG. 2. The anode electrodes 74R, 74G, and 74B can include a metal material including aluminum (Al), a laminate of indium tin oxide (ITO) and silver (Ag), or the like, for example. A metal-based material or metal oxide can also be used. Examples of the metal-based material include an Al-based alloy such as an alloy with copper (Cu), nickel (Ni), or neodymium (Nd), and an Ag alloy. Moreover, examples of the metal oxide include indium zink oxide (IZO) and titanium oxide (TiOx).

In the pixel array described above, a groove 80 is formed among the R, G, and B monochrome pixels 20R, 20G, and 20B in the interlayer film 72 along the direction of arrangement of the pixels, where the depth of the groove is deep enough to reach a wiring layer including the wiring 77 described above. The pixels 20R, 20G, and 20B are thus separated by the groove 80. The contact electrode 75 is provided at the bottom of the groove 80. A predetermined potential such as 0 V is applied to the contact electrode 75 through a power supply terminal (not shown) across the entire light-emitting pixel area.

The cathode electrode 73 as an upper electrode is formed pixel by pixel on the organic EL elements 21R, 21G, and 21B by vacuum deposition. The cathode electrode 73 can be formed using material such as ITO, IZO, zinc oxide (ZnO), MgAg, and the like. In the forming of the organic EL elements 21R, 21G, and 21B and the cathode electrode 73, the cathode electrode 73 can be formed along a side wall of the groove 80 by changing a vapor deposition condition for the organic EL elements 21R, 21G, and 21B and the cathode electrode 73 and making a difference in the throwing power of deposited particles between the organic EL elements 21R, 21G, and 21B and the cathode electrode 73.

Here, examples of the vapor deposition condition include a degree of vacuum, a vapor deposition rate, a vapor deposition temperature, a direction of travel of the deposited molecules (particles), and the like. The direction of travel of the deposited particles can be controlled by using a control plate. As an example, the control plate is used to increase the linearity of the deposited molecules and decrease coverage (coatability) as the vapor deposition condition for the organic EL elements 21R, 21G, and 21B, whereas the coverage is increased without using the control plate as the vapor deposition condition for the cathode electrode 73. As a result, the deposited particles for the cathode electrode 73 can have higher throwing power than that for the organic EL elements 21R, 21G, and 21B, so that a difference can be made in the throwing power between the organic EL elements 21R, 21G, and 21B and the cathode electrode 73.

As described above, the cathode electrode 73 is formed along the side wall of the groove 80 by making the difference in the throwing power of the deposited particles, whereby the cathode electrode 73 can be electrically connected to the contact electrode 75 provided at the bottom of the groove 80. Then, the potential of the cathode electrode 73 for each of the organic EL elements 21R, 21G, and 21B deposited pixel by pixel can be set to the potential of the contact electrode 75 (0 V in the present example). Therefore, the cathode electrode 73 for each of the organic EL elements 21R, 21G, and 21B becomes an electrode common to all the pixels in terms of potential.

Here, it is preferable to provide an auxiliary electrode 78 on the side wall of the groove 80, particularly on the side wall toward the bottom thereof, and make the side wall of the groove 80 conductive in addition to the contact electrode 75 at the bottom of the groove 80. As a result, the electrical connection of the cathode electrode 73 to the contact electrode 75 inside the groove 80 can be more reliable.

Figure 6:
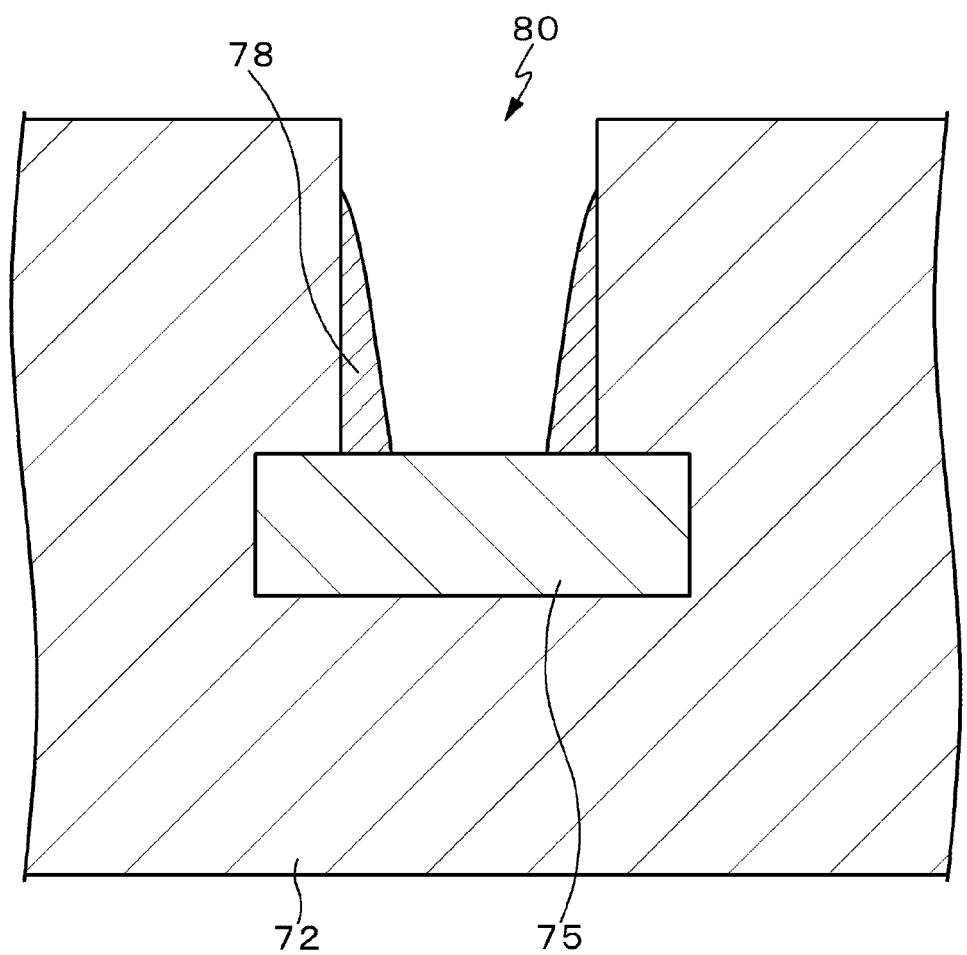
FIG. 6 is an enlarged view illustrating a groove, a contact electrode, and an auxiliary electrode in the panel structure according to the first example.

FIG. 6 illustrates an enlarged view of the groove 80, the contact electrode 75, and the auxiliary electrode 78 in the panel structure according to the first example. The contact electrode 75 is desirably formed using a conductive material such as an indium compound, tungsten, copper, aluminum, titanium nitride, or tantalum nitride, for example. As with the contact electrode 75, the auxiliary electrode 78 is desirably formed using a conductive material such as an indium compound, tungsten, copper, aluminum, titanium nitride, or tantalum nitride, for example.

A protective film 76 is deposited on the cathode electrode 73 by vacuum deposition across the entire surface of the pixel array. The protective film 76 can be formed using an inorganic material such as silicon oxide ($SiO_x$), silicon nitride ($SiN_x$), silicon oxynitride ($SiN_xO_y$), titanium oxide ($TiO_x$), or aluminum oxide ($Al_xO_y$), for example. Regarding the deposition of the protective film 76, as with the deposition of the cathode electrode 73, the throwing power of the deposited particles for the protective film 76 is higher than that for the organic EL elements 21R, 21G, and 21B. As a result, the organic EL elements 21R, 21G, and 21B can be separated pixel by pixel by closing peripheral edges of the pixels 20R, 20G, and 20B with the protective film 76 inside the groove 80.

As described above, according to the first example, the cathode electrode 73 can be electrically connected to the contact electrode 75 in the groove 80 formed along the direction of arrangement of the pixels among the R, G, and B pixels 20R, 20G, and 20B in the interlayer film 72, that is, in the light-emitting pixel area. This eliminates the need to separately form the vapor deposition areas for the organic EL elements 21R, 21G, and 21B and the cathode electrode 73 using the deposition mask, and enables the cathode electrode 73 and the contact electrode 75 to be connected in a self-aligning manner. As a result, the contact electrode 75 need not be provided on the outer periphery of the light-emitting pixel area so that the frame of the display panel 70 can be narrowed (chip size can be reduced) accordingly, and cost can be reduced accordingly.

Moreover, by closing the peripheral edges of the pixels 20R, 20G, and 20B with the protective film 76 in the groove 80, the organic EL elements 21R, 21G, and 21B can each be protected with the protective film 76 for each pixel while separating each of the pixels 20R, 20G, and 20B. This allows the organic EL elements 21R, 21G, and 21B to be processed by photolithography technique, so that the R, G, and B monochrome pixels 20R, 20G, and 20B can be formed separately using the R, G, and B monochrome organic EL materials. Furthermore, in each of the pixels 20R, 20G, and 20B, a leakage current can be drawn into the auxiliary electrode 78 and the contact electrode 75 so that color mixture due to light emission of an adjacent pixel can be suppressed.

Figure 7:
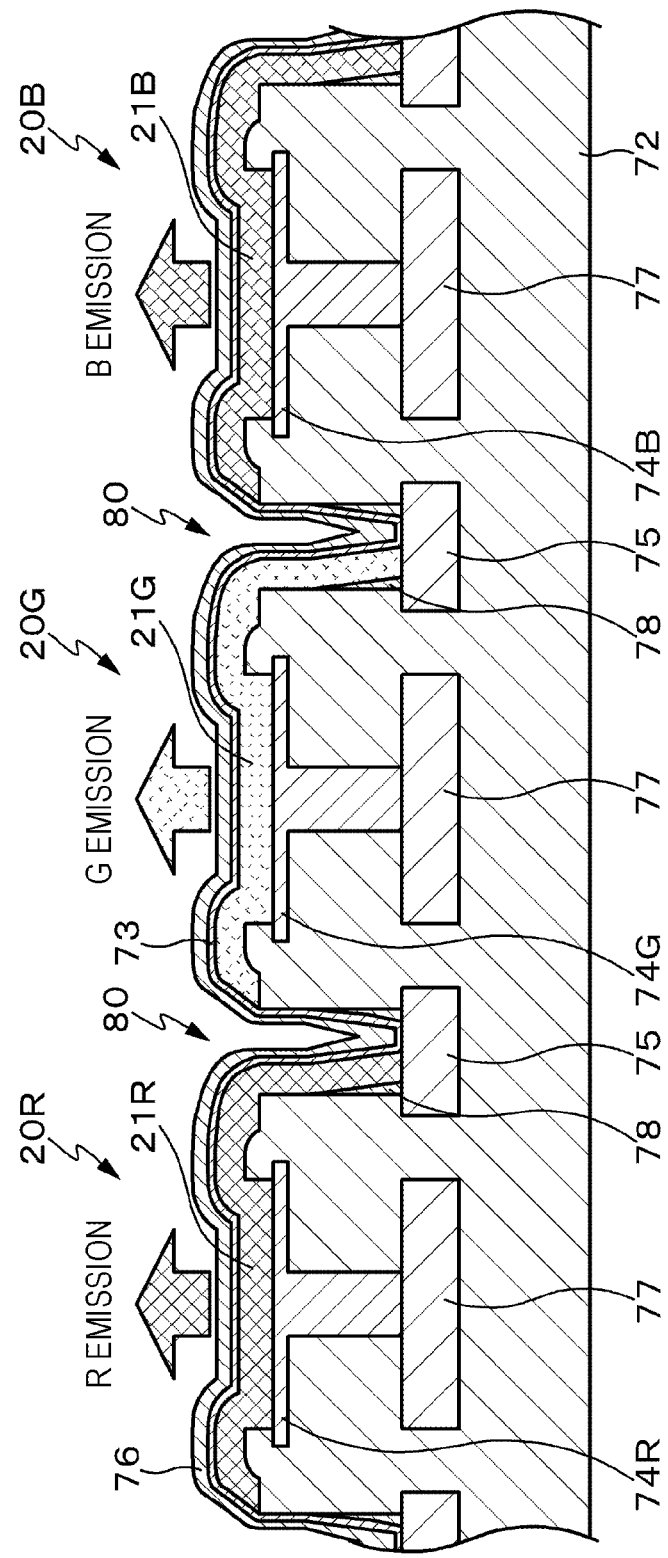
FIG. 7 is a cross-sectional end view illustrating a cross-sectional structure of a main part of a panel structure according to a variation of the first example.

FIG. 7 illustrates a variation of the panel structure according to the first example. The cathode electrode 73 and the contact electrode 75 need only be partially in contact with each other. Therefore, as illustrated in FIG. 7, it is possible to adopt a structure in which the entire layer is offset from the center of the groove 80.

Note that the protective film 76 has a single-layer structure in the present example, but can also have a multilayer structure with two or more layers. The protective film 76 having the multilayer structure can enhance the protection of each of the organic EL elements 21R, 21G, and 21B.

Figure 8:
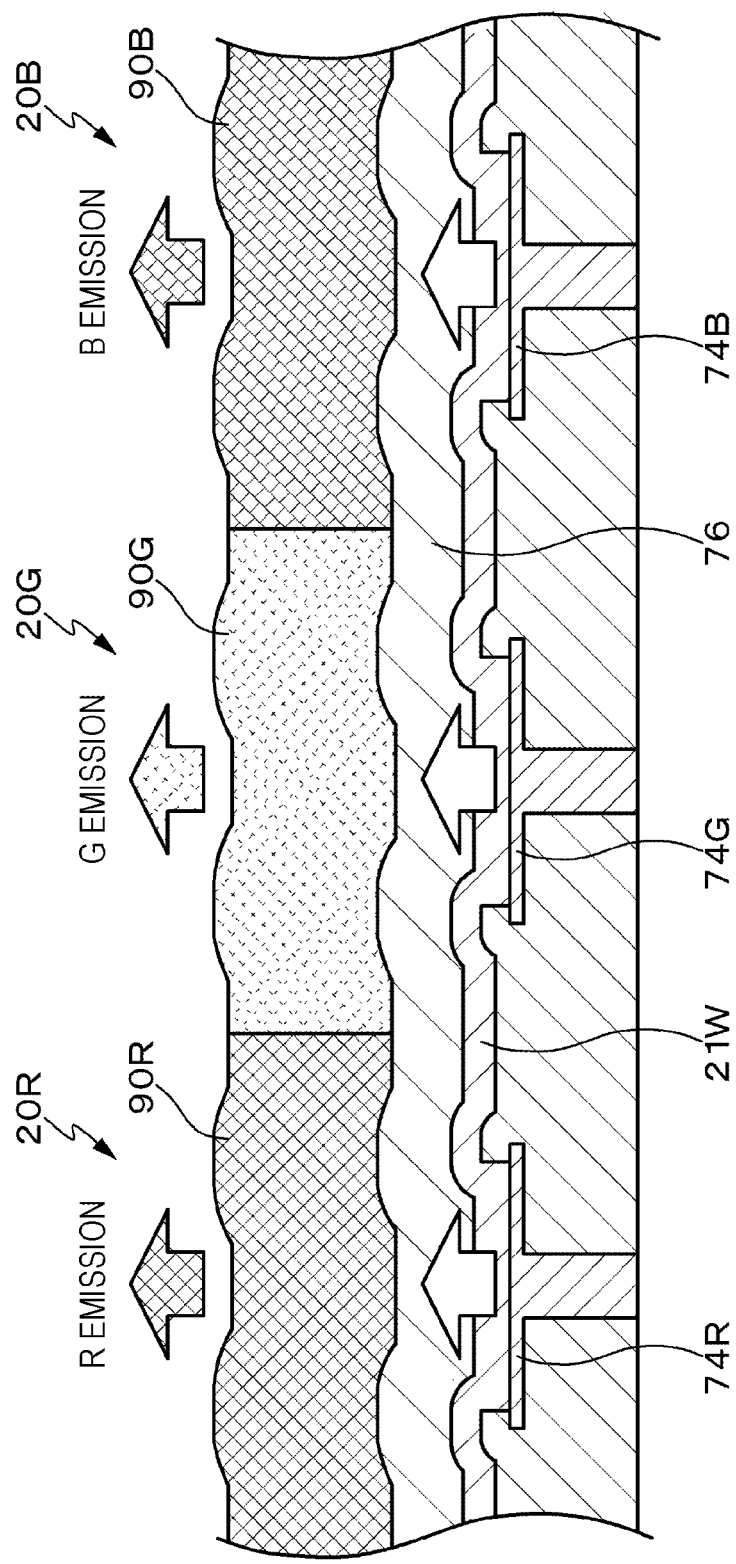
FIG. 8 is a cross-sectional view illustrating a cross-sectional structure of a main part of the panel structure obtained by a combination of a white organic EL element and a color filter.

Now, there are roughly two types of methods for forming the pixels 20R, 20G, and 20B. One of them is a method of forming the organic EL layer by the pixel (sub-pixel) by separately making the monochromatic light-emitting organic EL materials corresponding to a plurality of colors, for example, R, G, and B, with the use of a deposition mask. The other one is, as illustrated in FIG. 8, a method of forming a white organic EL element (white organic EL layer) 21W in common for all the pixels (sub-pixels) by depositing a white (W) light-emitting organic EL material having a multicolor emission spectrum over the entire surface of the light-emitting pixel area, and performing dispersion using color filters 90R, 90G, and 90B having optical spectra corresponding to a plurality of colors, for example, R, G, and B.

The former has an advantage of high luminous efficiency because the monochromatic emission of R, G, and B is directly extracted without using the color filters 90R, 90G, and 90B. However, the alignment accuracy of the deposition mask is limited so that the method is not suitable for a pixel pitch of 100 μm or less. On the other hand, the latter does not require the alignment accuracy of the deposition mask as much as the former, and can be applied to a pixel pitch of 10 μm or less. However, a loss of light occurs when the light emitted from the white organic EL element 21W is dispersed by the color filters 90R, 90G, and 90B, so that the luminous efficiency is reduced to ⅓ or less.

On the other hand, the panel structure according to the first example allows the organic EL elements 21R, 21G, and 21B to be processed by photolithography technique, so that the R, G, and B monochrome pixels 20R, 20G, and 20B can be formed separately using the R, G, and B monochrome organic EL elements. Therefore, the display panel having high luminous efficiency can be realized because the monochromatic emission of R, G, B, and the like can be extracted directly without using the color filters 90R, 90G, and 90B. Moreover, the contact electrode 75 need not be designed in anticipation of relative misalignment between the deposition mask and the substrate at the time of vapor deposition of the cathode electrode 73, so that the above structure can be applied to a pixel pitch of 10 µm or less.

Second Example

Figure 9:
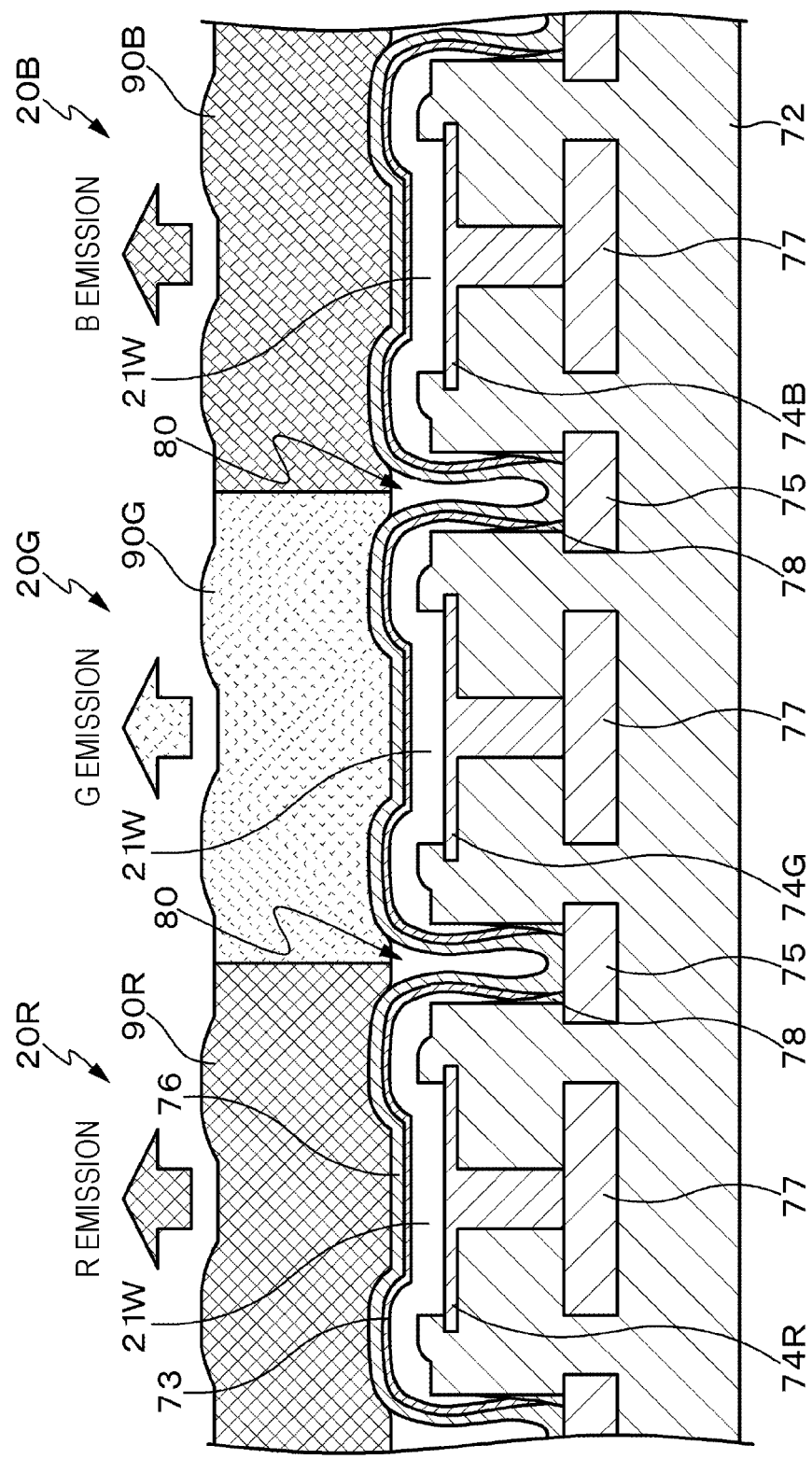
FIG. 9 is a cross-sectional view illustrating a cross-sectional structure of a main part of a panel structure according to a second example.

A second example is an example in which an organic EL layer is formed using a white light-emitting organic EL material in the panel structure of the organic EL display device 10 according to the present embodiment. FIG. 9 is a cross-sectional view illustrating a cross-sectional structure of a main part of the panel structure according to the second example. Here, the figure illustrates the cross-sectional structure of three pixels (sub-pixels) 20R, 20G, and 20B corresponding to R, G, and B arranged adjacent to one another.

The panel structure according to the first example forms the organic EL layer using the monochromatic light-emitting organic EL materials corresponding to R, G, and B, whereas the panel structure according to the second example forms the organic EL layer using the white light-emitting organic EL material. That is, as with the panel structure illustrated in FIG. 8, the panel structure according to the second example is obtained by a combination of the white organic EL element 21W and the color filters 90R, 90G, and 90B having optical spectra corresponding to a plurality of colors. The panel structure according to the second example thus has a structure in which monochromatic emission corresponding to R, G, and B is extracted through the color filters 90R, 90G, and 90B, thereby having lower luminous efficiency than the panel structure according to the first example.

Although having low luminous efficiency, the panel structure according to the second example also adopts the configuration in which the groove 80 is formed along the direction of arrangement of the pixels among the R, G, and B pixels 20R, 20G, and 20B in the interlayer film 72, and the cathode electrode 73 is electrically connected to the contact electrode 75 inside the groove 80. As a result, the contact electrode 75 need not be provided on the outer periphery of the light-emitting pixel area so that the frame of the display panel 70 can be narrowed, and cost can be reduced accordingly. Furthermore, in each of the pixels 20R, 20G, and 20B, a leakage current can be drawn into the auxiliary electrode 78 and the contact electrode 75 so that color mixture due to light emission of an adjacent pixel can be suppressed.

Third Example

Figure 10:
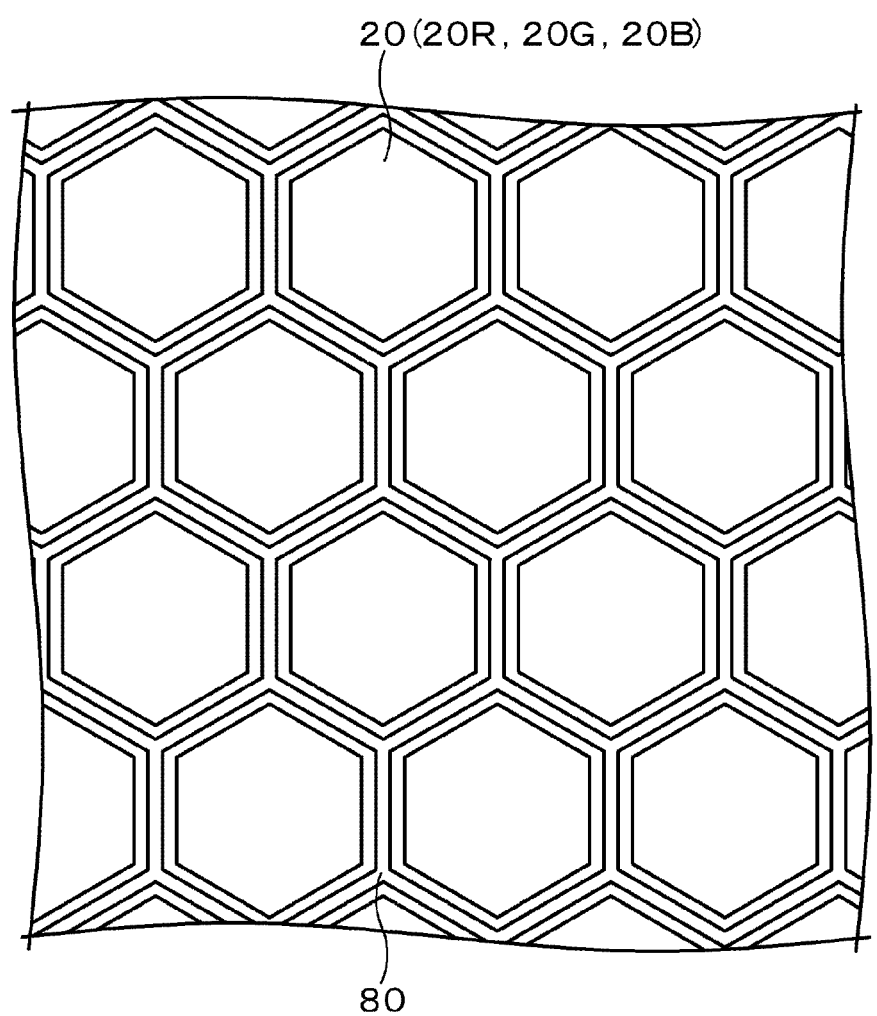
FIG. 10 is a plan view illustrating a first shape example of the pixel according to a third example.
Figure 11:
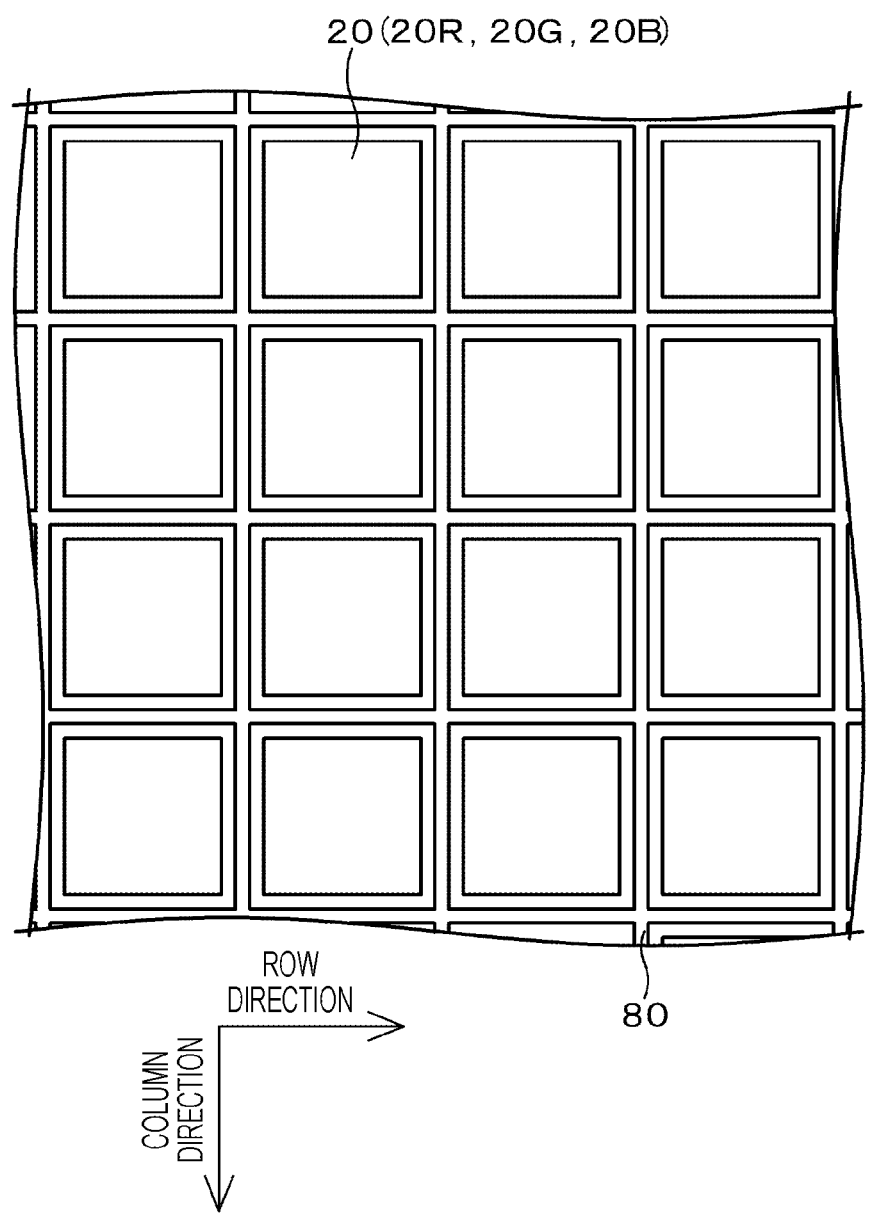
FIG. 11 is a plan view illustrating a second shape example of the pixel according to the third example.
Figure 12:
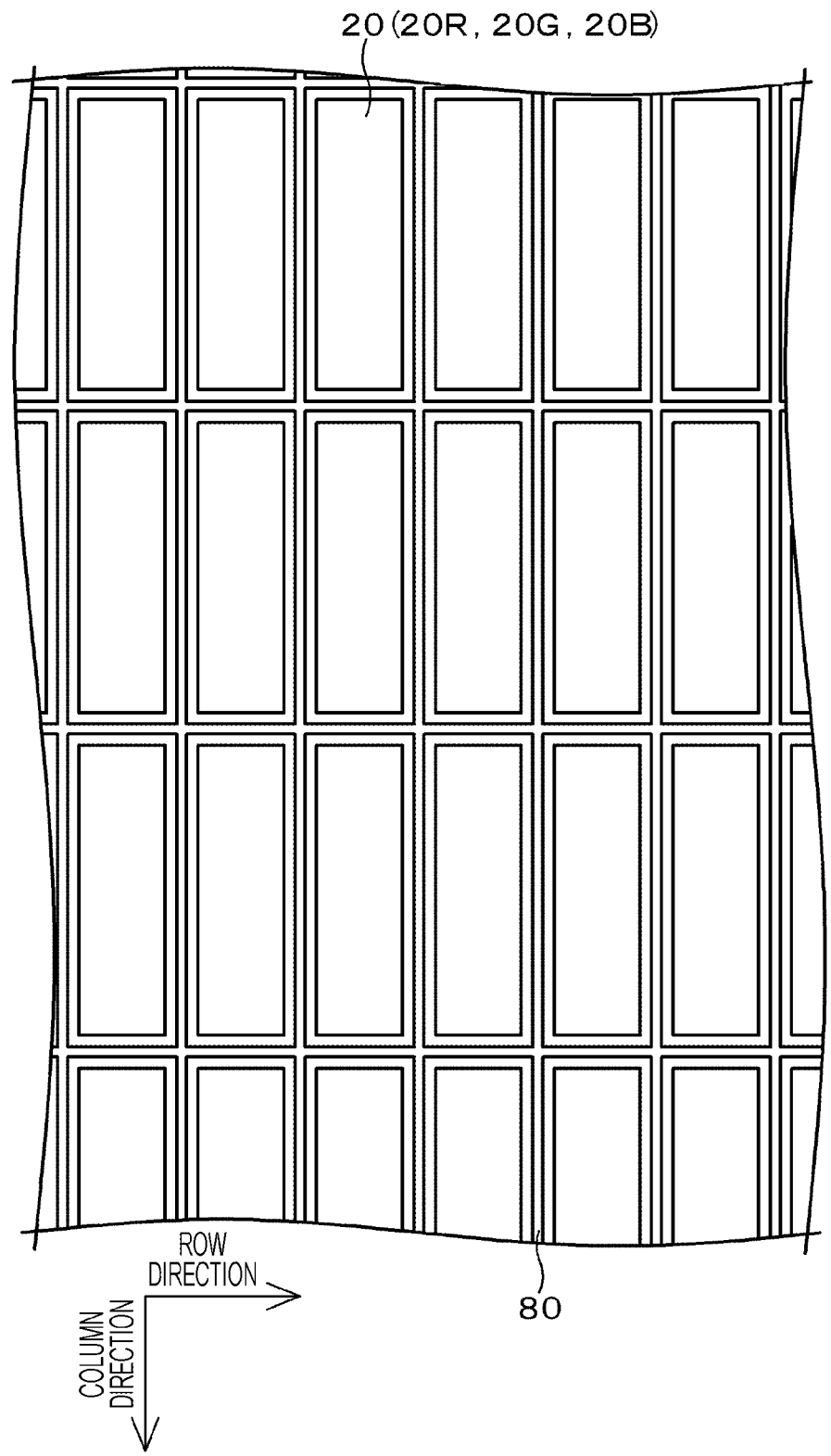
FIG. 12 is a plan view illustrating a third shape example of the pixel according to the third example.

A third example is an example of various planar shapes of the pixel 20 (20R, 20G, 20B). FIG. 10 is a plan view illustrating a first shape example of the pixel 20 according to the third example, FIG. 11 is a plan view illustrating a second shape example of the pixel 20 according to the third example, and FIG. 12 is a plan view illustrating a third shape example of the pixel 20 according to the third example.

Figure 13:
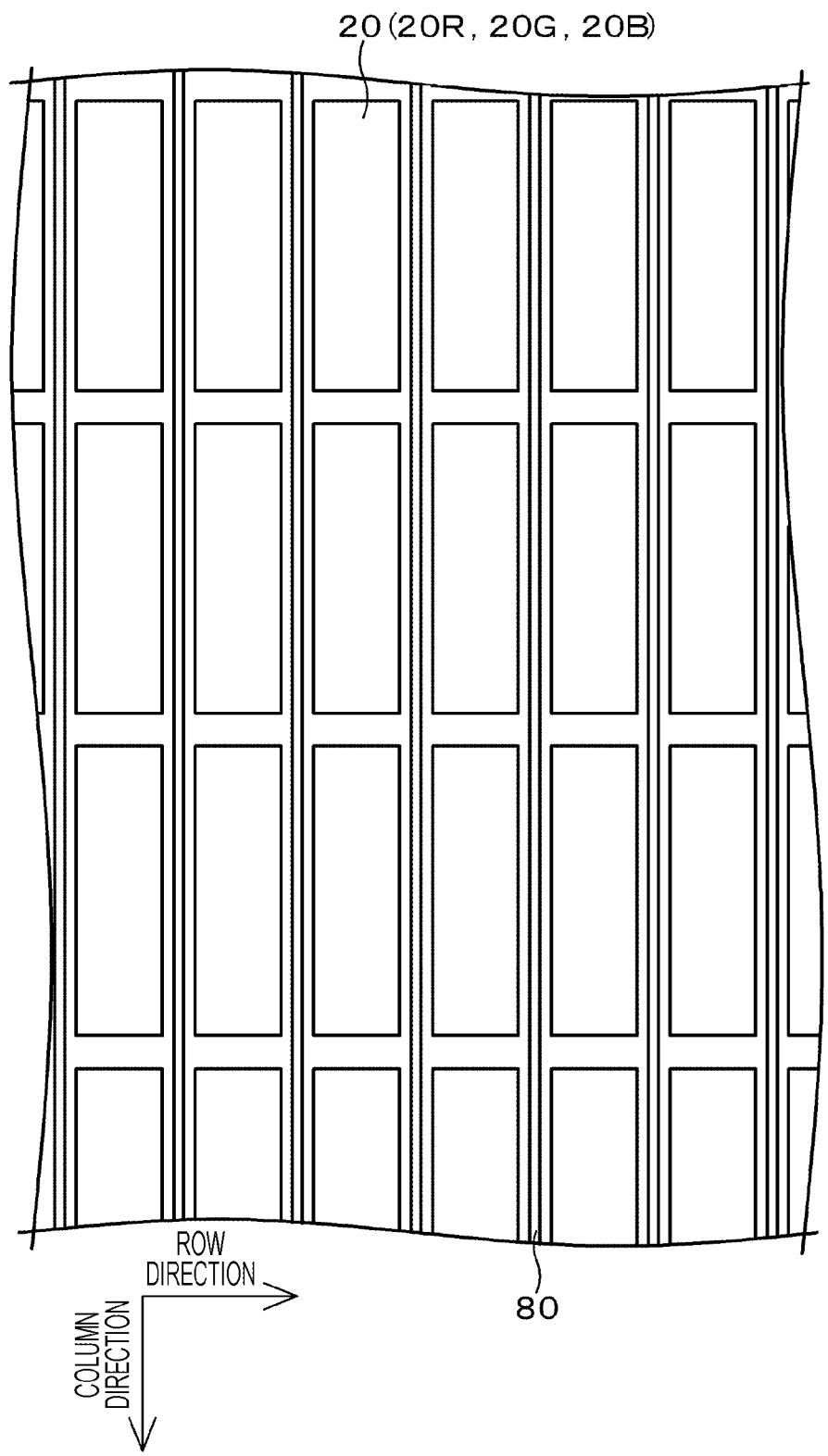
FIG. 13 is a plan view illustrating a variation of the third shape example of the pixel according to the third example.

The first shape example illustrated in FIG. 10 is an example in which the planar shape of the pixel 20 is a honeycomb shape (regular hexagon). In the pixel array formed by the arrangement of the pixels 20 having the honeycomb shape, the groove 80 is formed along the outer periphery of the pixel 20. The second shape example illustrated in FIG. 11 is an example in which the planar shape of the pixel 20 is a square shape. In the pixel array formed by the arrangement of the pixels 20 having the square shape, the groove 80 is formed along both a row direction and a column direction. However, the direction along which the groove 80 is formed is not limited to both the row direction and the column direction, but may be one direction (column direction) in a case where the pixel array is a stripe array of R, G, and B. The third shape example illustrated in FIG. 12 is an example in which the planar shape of the pixel 20 is a rectangular shape that is long in the column direction. In the pixel array formed by the arrangement of the pixels 20 having the rectangular shape, the groove 80 is formed along both the row direction and the column direction. However, the direction along which the groove 80 is formed is not limited to the row direction and the column direction, but may be one direction (column direction) as illustrated in FIG. 13 in a case where the pixel array is a stripe array of R, G, and B.

Fourth Example

Figure 14:
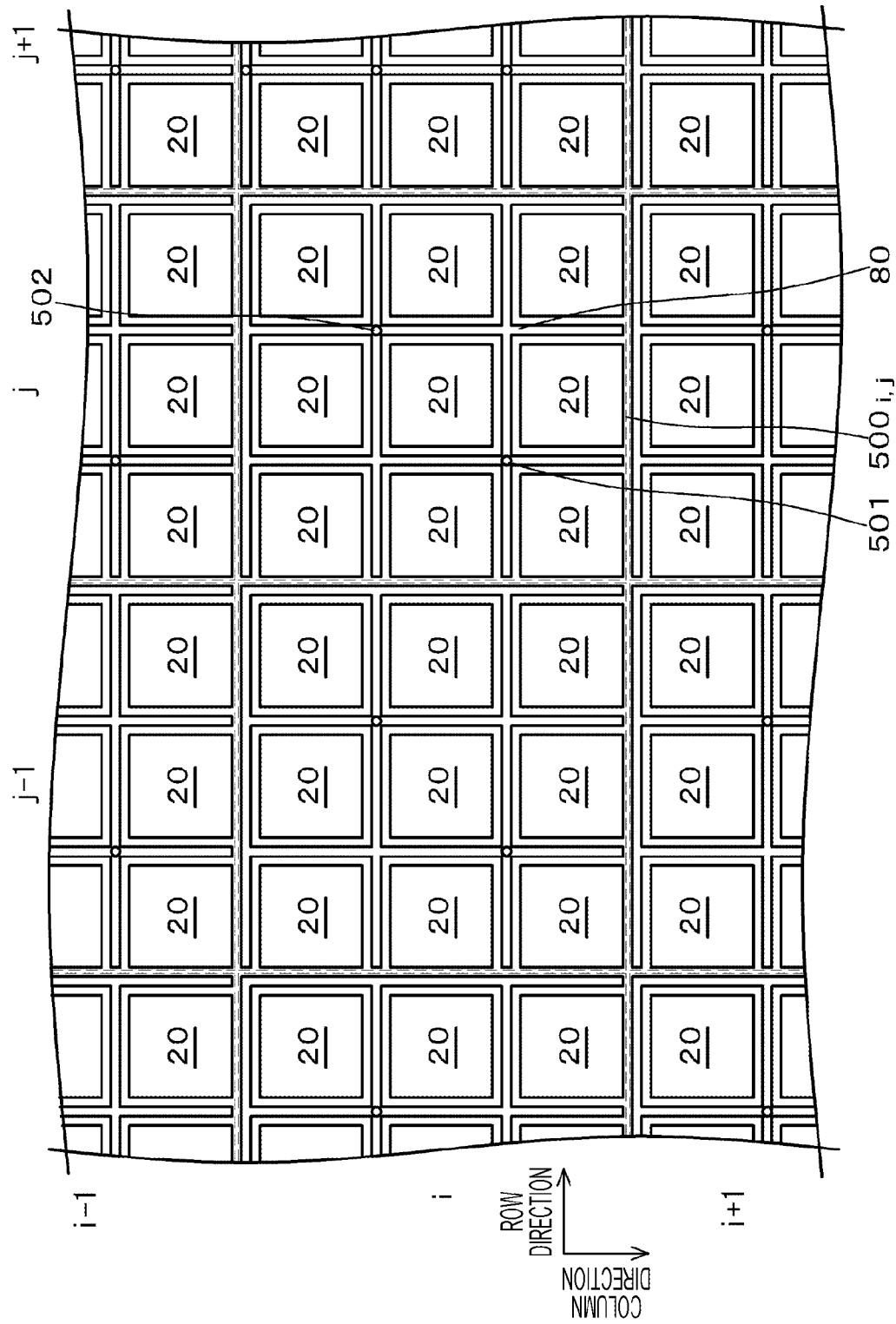
FIG. 14 is a plan view illustrating a part of a pixel array according to a fourth example.

A fourth example is a variation of the third example and is another example of the groove 80. FIG. 14 is a plan view illustrating a part of a pixel array according to the fourth example.

The third example adopts the configuration in which, in the pixel array formed by the arrangement of the pixels 20 having the honeycomb shape, the pixels 20 having the square shape, or the pixels 20 having the rectangular shape, a potential common to all the pixels is applied to the groove 80 formed along the row direction and the column direction. On the other hand, the fourth example adopts a configuration in which the pixel array unit 30 being the light-emitting pixel area is divided into a plurality of areas, and a potential different for each of the plurality of areas can be applied to the groove 80.

In the example of FIG. 14, in order to facilitate understanding, one area has a size of 3×3 pixels, for example, and a plurality of areas 500 each having the size is arranged in a matrix with the groove 80 provided for these plurality of areas 500 to be electrically isolated for each area. A predetermined potential is applied to the groove 80 electrically isolated for each area 500 through a contact unit provided for each area 500.

For example, in an area $500_{i,j}$ arranged i-th in the column direction and j-th in the row direction among the plurality of areas 500 arranged in the matrix, a predetermined potential is applied to the groove 80 through, for example, two contact units 501 and 502 each provided at an intersection of the grooves 80 in the center of the area $500_{i,j}$. In the present example, the contact unit is provided at two locations for one area $500_{i,j}$, which however is only an example, and the contact unit may be provided at one location or three or more locations, for example, for each pixel 20.

Furthermore, the potential applied to the groove 80 may be equal across the entire light-emitting pixel area, or may be different for each area 500. In other words, different potentials can be applied to the grooves 80 in the plurality of areas 500 by dividing the light-emitting pixel area into the plurality of areas 500 and electrically isolating the groove 80 for each area 500. As a result, by controlling the potentials applied to the grooves 80 in the plurality of areas 500 by the area 500, the display control by the area 500 such as reducing the leakage current in a completely black display or performing correction for display unevenness can be implemented for each area 500.

Fifth Example

Figure 15A:
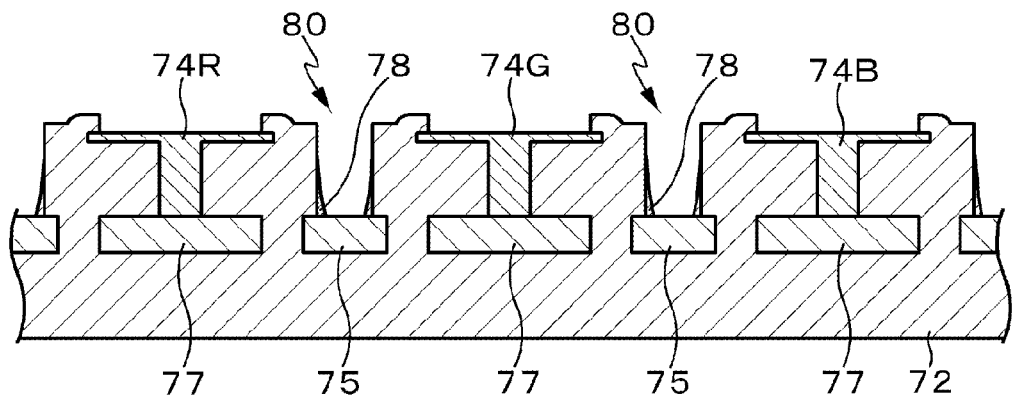
FIGS. 15A, 15B, and 15C are process diagrams (part one) illustrating an overview of a flow of a method of manufacturing (process of manufacturing) a panel structure according to a fifth example.
Figure 15B:
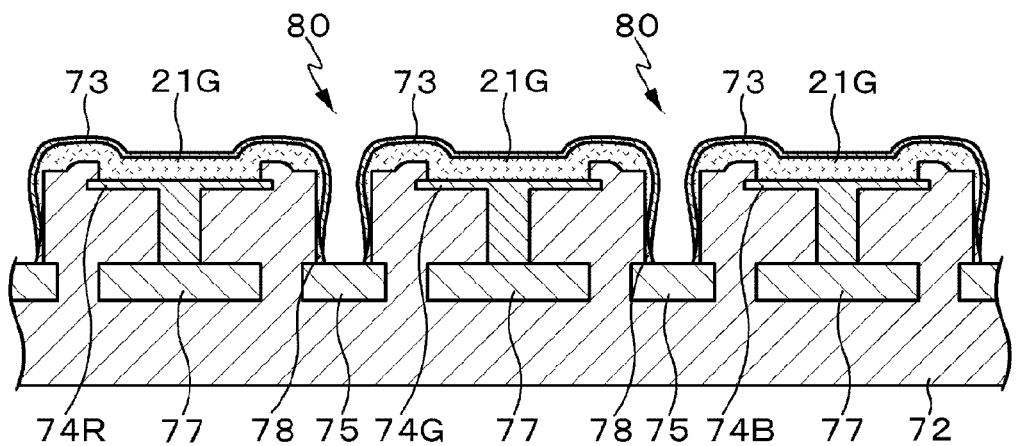
Figure 15C:
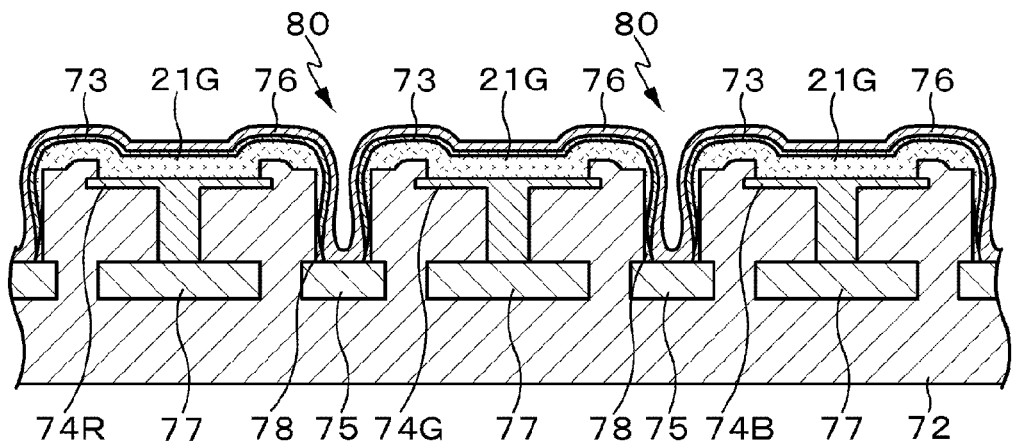
Figure 16A:
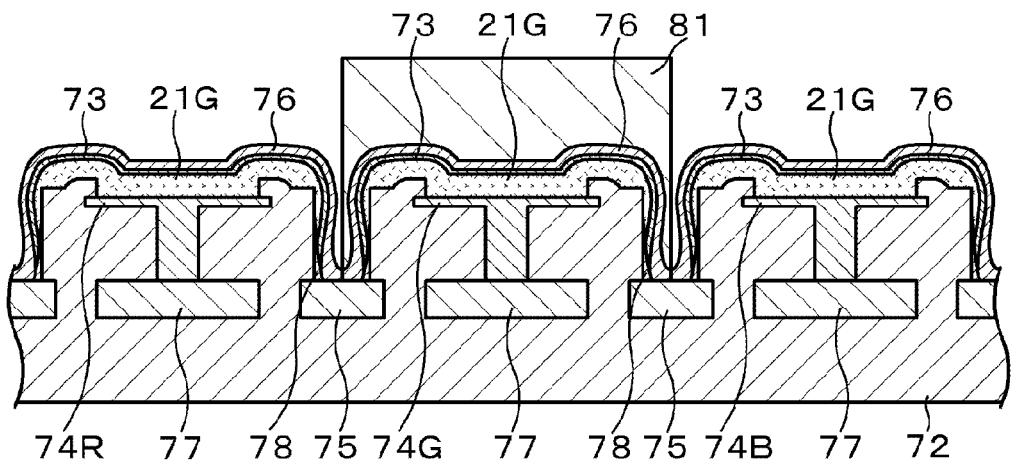
FIGS. 16A, 16B, and 16C are process diagrams (part two) illustrating the overview of the flow of the method of manufacturing (process of manufacturing) the panel structure according to the fifth example.
Figure 16B:
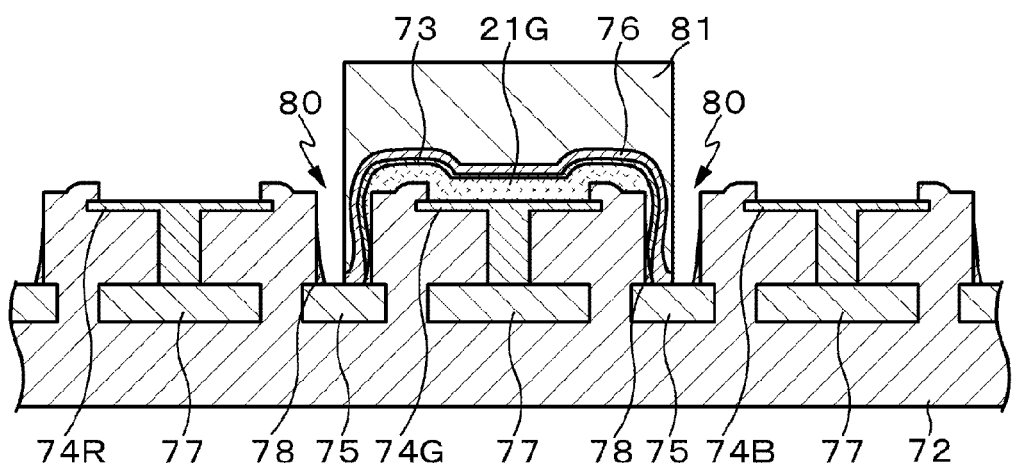
Figure 16C:
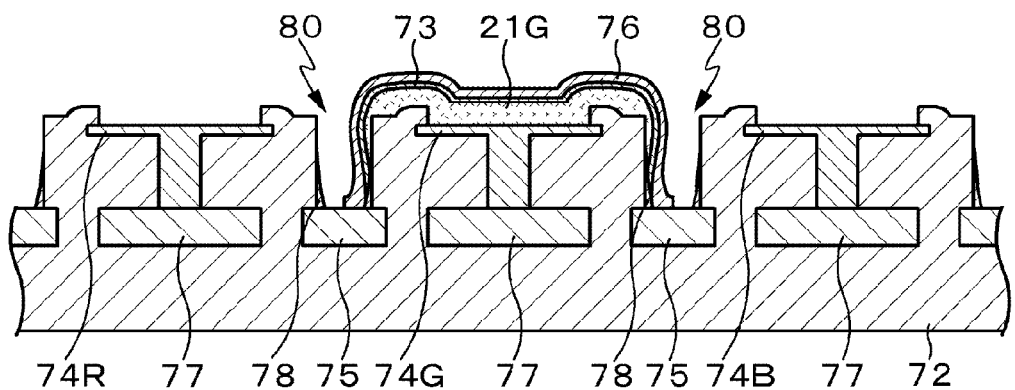

A fifth example is an example of a method of manufacturing the panel structure of the organic EL display device 10 according to the present embodiment, for example, the panel structure according to the first example. FIGS. 15A, 15B, and 15C are process diagrams (part one) illustrating a flow of the method of manufacturing (process of manufacturing) the panel structure according to the fifth example, and FIGS. 16A, 16B, and 16C are process diagrams (part two) illustrating a flow of the method of manufacturing the panel structure.

Before the process of FIG. 15A, on the semiconductor substrate (see FIG. 3B), the circuit unit for driving the organic EL element 21 and the wiring layer such as the wiring 77 of the circuit unit and the contact electrode 75 are formed, and the anode electrodes 74R, 74G, and 74B are also formed as the lower electrodes.

Then in the process of FIG. 15A, the groove 80 is formed along the direction of arrangement of the pixels among the R, G, and B monochrome pixels 20R, 20G, and 20B in the interlayer film 72 by photolithography and dry etching. The auxiliary electrode 78 is also formed on the side wall of the groove 80, in particular, on the side wall toward the bottom thereof, by using the same material as the contact electrode 75, for example. At this time, the auxiliary electrode 78 is electrically connected to the contact electrode 75.

In the process of FIG. 15B, for example, the organic EL layer corresponding to the green organic EL element 21G is formed by vacuum deposition, and then the cathode electrode 73 is formed as the upper electrode by vacuum deposition. At this time, the cathode electrode 73 can be formed along the side wall of the groove 80 by changing the vapor deposition condition for the organic EL element 21G and the cathode electrode 73 and making a difference in the throwing power of the deposited particles between the organic EL element 21G and the cathode electrode 73. The cathode electrode 73 is thus electrically connected to the contact electrode 75 through the auxiliary electrode 78.

In the process of FIG. 15C, the protective film 76 for protecting the cathode electrode 73 is deposited. In the process of FIG. 16A, the light-emitting area for the green pixel 20G is patterned by photolithography using a photoresist 81, and then the light-emitting area for the green pixel 20G is etched in the process of FIG. 16B. Then in the process of FIG. 16C, the photoresist 81 is removed. After that, the process returns to FIG. 15B, and the processing in the process of FIG. 15B onward is executed in the order of red and blue, for example, whereby the organic EL elements 21R and 21B are formed.

Note that in the method of manufacturing the panel structure according to the fifth example described above, the organic EL elements (organic EL layers) are formed in the order of green, red, and blue, which is merely an example so that the order of the colors is arbitrary.

Variation

Although the technique of the present disclosure has been described on the basis of the preferable embodiment, the technique of the present disclosure is not limited to the embodiment. The configuration and structure of the display device described in the above embodiment are examples and can be changed as appropriate. For example, the above embodiment assumes that the organic EL element 21 and its driving circuit are formed on the semiconductor substrate such as the silicon substrate, but the organic EL element and its driving circuit can also be formed on a transparent insulating substrate such as a glass substrate.

Moreover, the above embodiment has illustrated the circuit configuration illustrated in FIG. 2 as the pixel circuit, which is not limited thereto, but a transistor can be added as necessary. For example, a switching transistor can be connected between the drain electrode of the drive transistor 22 and a current discharge destination node (for example, the common power line 34) so that the organic EL element 21 can be controlled to not emit light during the non-light emitting period of the pixel 20 by the switching transistor.

Moreover, the above embodiment has described the case of the panel structure in which no contact electrode is provided on the outer periphery of the light-emitting pixel area, but it is also possible to adopt a configuration in which the contact electrode is provided on the outer periphery of the light-emitting pixel area, and then the cathode electrode 73 is electrically connected to the contact electrode 75 in the groove 80. By adopting this configuration, the width of the contact electrode provided on the outer periphery of the light-emitting pixel area can be reduced compared with the case of not adopting the configuration, whereby the frame of the display panel 70 can be narrowed accordingly.

Electronic Apparatus of Present Disclosure

The display device of the present disclosure described above can be used as a display unit (display device) of an electronic apparatus in any field that displays a video signal input to the electronic apparatus or a video signal generated in the electronic apparatus as an image or a video. Examples of the electronic apparatus include a television set, a laptop computer, a digital still camera, a mobile terminal apparatus such as a mobile phone, a head mounted display, and the like. However, the electronic apparatus is not limited to these.

Using the display device of the present disclosure as the display unit of the electronic apparatus in any field as described above can obtain the following effects. That is, according to the display device of the present disclosure, the frame of the display panel can be narrowed. Therefore, using the display device of the present disclosure can contribute to downsizing of the body of the electronic apparatus.

The display device of the present disclosure also includes one in the form of a module having a sealed configuration. As an example, the one in the form of a module includes a display module formed by attaching a facing unit such as transparent glass to the pixel array unit. Note that the display module may be provided with a circuit unit, a flexible printed circuit (FPC), or the like for inputting/outputting a signal and the like to the pixel array unit from the outside. Hereinafter, a digital still camera and a head mounted display will be exemplified as specific examples of the electronic apparatus using the display device of the present disclosure. However, the specific examples exemplified here are only examples and are not limited thereto.

First Specific Example

Figure 17A:
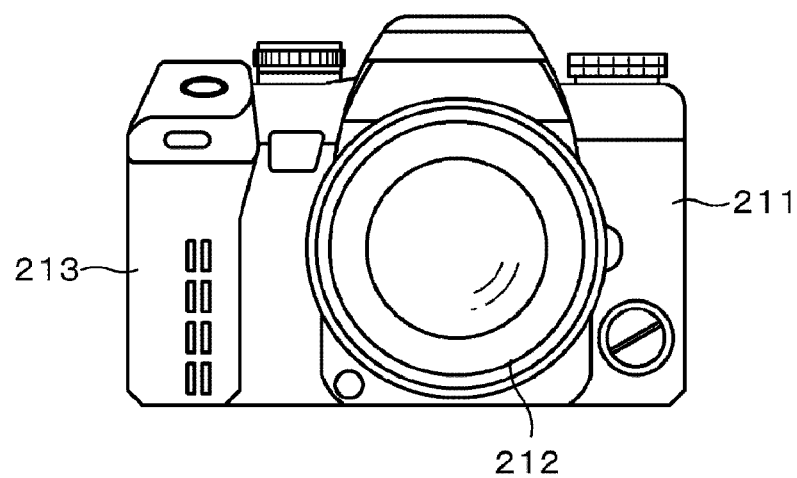
FIG. 17A is a front view of a single-lens reflex digital still camera with interchangeable lenses according to a first specific example of an electronic apparatus of the present disclosure.
Figure 17B:
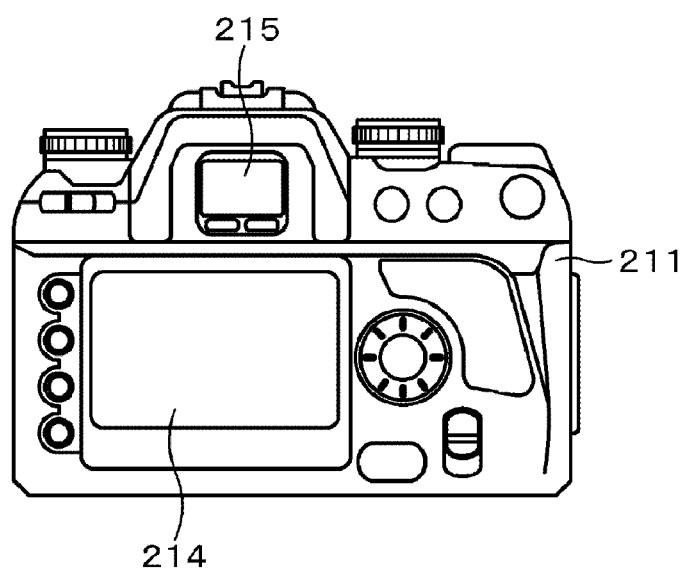
FIG. 17B is a rear view thereof.

FIG. 17 is an external view of a single-lens reflex digital still camera with interchangeable lenses according to a first specific example of the electronic apparatus of the present disclosure, where FIG. 17A illustrates a front view thereof and FIG. 17B illustrates a rear view thereof.

The single-lens reflex digital still camera with interchangeable lenses according to the present first specific example includes, for example, an interchangeable imaging lens unit (interchangeable lens) 212 on the front right side of a camera body unit (camera body) 211 and a grip unit 213 to be held by an image-capturing person on the front left side of the camera body unit.

In addition, a monitor 214 is provided roughly in the center of the back of the camera body unit 211. An electronic viewfinder (eyepiece window) 215 is provided above the monitor 214. The image-capturing person can determine the composition by looking into the electronic viewfinder 215 and visually recognizing an optical image of a subject guided by the imaging lens unit 212.

In the single-lens reflex digital still camera with interchangeable lenses having the above configuration, the display device of the present disclosure can be used as the electronic viewfinder 215 of the camera. That is, the single-lens reflex digital still camera with interchangeable lenses according to the present first specific example is fabricated by using the display device of the present disclosure as the electronic viewfinder 215 of the camera.

Second Specific Example

Figure 18:
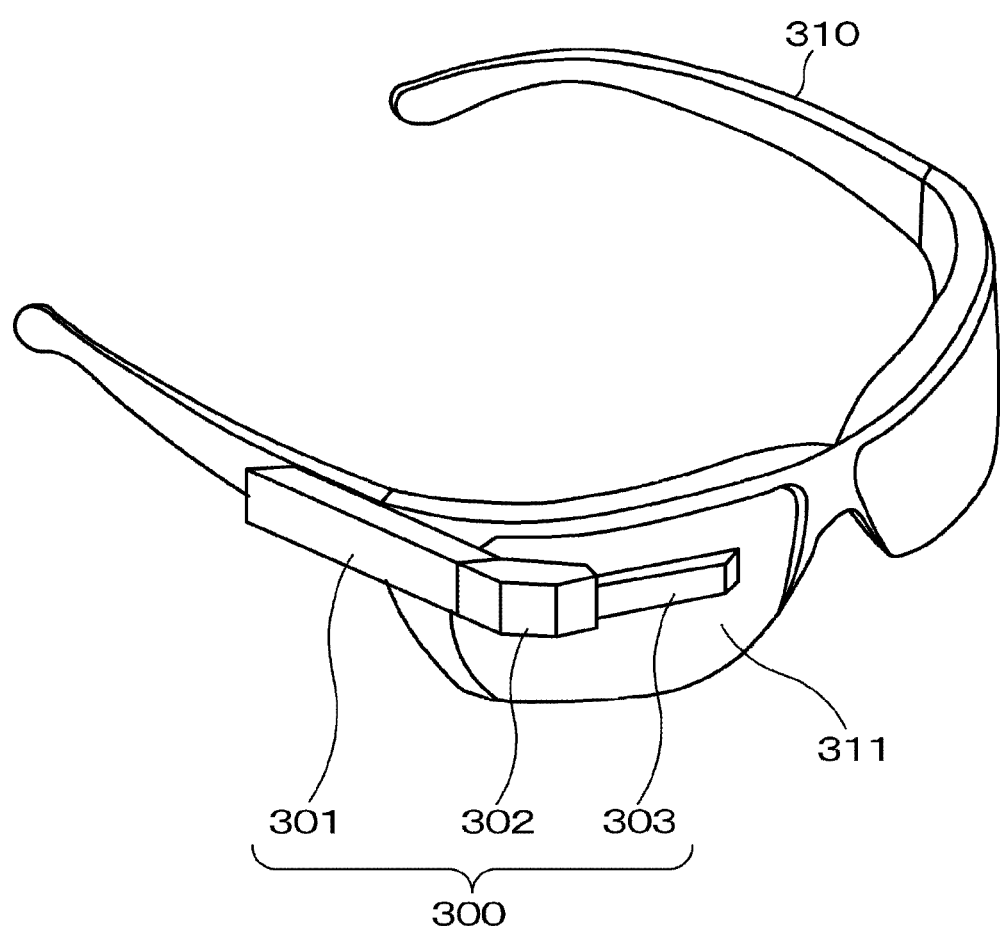
FIG. 18 is an external view illustrating an example of a head mounted display according to a second specific example of the electronic apparatus of the present disclosure.

FIG. 18 is an external view illustrating an example of a head mounted display according to a second specific example of the electronic apparatus of the present disclosure.

A head mounted display 300 according to the present second specific example has a configuration of a transmissive head mounted display including a body unit 301, an arm unit 302, and a lens barrel 303. The body unit 301 is connected to the arm unit 302 and glasses 310. Specifically, a longitudinal end of the body unit 301 is attached to the arm unit 302. Moreover, one side of a side surface of the body unit 301 is joined to the glasses 310 via a connection member (not shown). Note that the body unit 301 may be directly mounted on a human head.

The body unit 301 incorporates a control board for controlling the operation of the head mounted display 300 and a display unit. The arm unit 302 supports the lens barrel 303 with respect to the body unit 301 by joining the body unit 301 and the lens barrel 303. Specifically, the arm unit 302 is coupled to the end of the body unit 301 and an end of the lens barrel 303, thereby fixing the lens barrel 303 to the body unit 301. The arm unit 302 also incorporates a signal line for communicating data related to an image provided from the body unit 301 to the lens barrel 303.

The lens barrel 303 projects image light provided from the body unit 301 via the arm unit 302 toward an eye of a user wearing the head mounted display 300 through a lens 311 of the glasses 310.

In the head mounted display 300 having the above configuration, the display device of the present disclosure can be used as a display unit built in the body unit 301. That is, the head mounted display 300 according to the present second specific example is fabricated by using the display device of the present disclosure as the display unit of the head mounted display.

Configuration that Can be Adopted by Present Disclosure

Note that the present disclosure can also adopt the following configurations.

A. Display Device

[A-1] A display device including:
an organic EL layer deposited on a circuit unit formed on a substrate via an insulating film;
a cathode electrode deposited on the organic EL layer;
a groove formed along a direction of arrangement of pixels between the pixels in the insulating film; and
a contact electrode that is provided at a bottom of the groove and receives a predetermined potential, in which
the cathode electrode is electrically connected to the contact electrode in the groove.

[A-2] The display device according to [A-1] above, in which
an auxiliary electrode that electrically connects the cathode electrode and the contact electrode is provided on a side wall of the groove.

[A-3] The display device according to [A-1] or [A-2] above, in which
the contact electrode receives an equal potential across an entire light-emitting pixel area.

[A-4] The display device according to [A-1] or [A-2] above, in which
the light-emitting pixel area is divided into a plurality of areas, and the contact electrode is electrically isolated for each of the plurality of areas, and
the contact electrode in each of the plurality of areas receives a potential different for each area.

[A-5] The display device according to [A-1] to [A-4] above, in which
the organic EL layer is formed pixel by pixel with a monochromatic light-emitting organic EL material corresponding to a plurality of colors.

[A-6] The display device according to [A-1] to [A-4] above, in which
the organic EL layer is formed in common for all pixels with a white light-emitting organic EL material, and
white light emitted from the organic EL layer is dispersed by a color filter having an optical spectrum for a plurality of colors.

[A-7] The display device according to [A-1] to [A-6] above, in which
a drive circuit unit of a light-emitting unit including the organic EL layer is formed on a semiconductor substrate.

B. Method of Manufacturing Display Device

[B-1] A method of manufacturing a display device, in manufacturing the display device including
an organic EL layer deposited on a circuit unit formed on a substrate via an insulating film, and
a cathode electrode deposited on the organic EL layer, including:
forming a groove along a direction of arrangement of pixels between the pixels in the insulating film, and providing a contact electrode that receives a predetermined potential at a bottom of the groove; and
electrically connecting the cathode electrode to the contact electrode in the groove.

[B-2] The method of manufacturing a display device according to [B-1] above, in which
an auxiliary electrode that electrically connects the cathode electrode and the contact electrode is formed on a side wall of the groove.

[B-3] The method of manufacturing a display device according to [B-1] or [B-2] above, in which
the contact electrode receives an equal potential across an entire light-emitting pixel area.

[B-4] The method of manufacturing a display device according to [B-1] or [B-2] above, in which the light-emitting pixel area is divided into a plurality of areas, and the contact electrode is electrically isolated for each of the plurality of areas, and the contact electrode in each of the plurality of areas receives a potential different for each area.

[B-5] The method of manufacturing a display device according to [B-1] to [B-4] above, in which the organic EL layer is formed pixel by pixel with a monochromatic light-emitting organic EL material corresponding to a plurality of colors.

[B-6] The method of manufacturing a display device according to [B-1] to [B-4] above, in which the organic EL layer is formed in common for all pixels with a white light-emitting organic EL material, and white light emitted from the organic EL layer is dispersed by a color filter having an optical spectrum for a plurality of colors.

[B-7] The method of manufacturing a display device according to [B-1] to [B-6] above, in which a drive circuit unit of a light-emitting unit including the organic EL layer is formed on a semiconductor substrate.

C. Electronic Apparatus

[C-1] An electronic apparatus having a display device including:

an organic EL layer deposited on a circuit unit formed on a substrate via an insulating film;

a cathode electrode deposited on the organic EL layer;

a groove formed along a direction of arrangement of pixels between the pixels in the insulating film; and a contact electrode that is provided at a bottom of the groove and receives a predetermined potential, in which the cathode electrode is electrically connected to the contact electrode in the groove.

[C-2] The electronic apparatus according to [C-1] above, in which an auxiliary electrode that electrically connects the cathode electrode and the contact electrode is provided on a side wall of the groove.

[C-3] The electronic apparatus according to [C-1] or [C-2] above, in which the contact electrode receives an equal potential across an entire light-emitting pixel area.

[C-4] The electronic apparatus according to [C-1] or [C-2] above, in which the light-emitting pixel area is divided into a plurality of areas, and the contact electrode is electrically isolated for each of the plurality of areas, and the contact electrode in each of the plurality of areas receives a potential different for each area.

[C-5] The electronic apparatus according to [C-1] to [C-4] above, in which the organic EL layer is formed pixel by pixel with a monochromatic light-emitting organic EL material corresponding to a plurality of colors.

[C-6] The electronic apparatus according to [C-1] to [C-4] above, in which the organic EL layer is formed in common for all pixels with a white light-emitting organic EL material, and white light emitted from the organic EL layer is dispersed by a color filter having an optical spectrum for a plurality of colors.

[C-7] The electronic apparatus according to [C-1] to [C-6] above, in which a drive circuit unit of a light-emitting unit including the organic EL layer is formed on a semiconductor substrate.

REFERENCE SIGNS LIST

10 Organic EL display device
20 (20R, 20G, 20B) Pixel (sub-pixel)
21 (21R, 21G, 21B, 21W) Organic EL element (organic EL layer)
22 Drive transistor
23 Sampling transistor
24 Light emission control transistor
25 Holding capacitor
26 Auxiliary capacitor
30 Pixel array unit
40 Write scanning unit
50 Drive scanning unit
60 Signal output unit
70 Display panel
71 Semiconductor substrate
72 Interlayer film
73 Cathode electrode (upper electrode)
74 (74R, 74G, 74B) Anode electrode (lower electrode)
75 Contact electrode
76 Protective film
77 Circuit unit wiring
78 Auxiliary electrode
80 Groove
90R, 90G, 90B Color filter

The invention claimed is:

1. A display device comprising:
   an organic EL layer deposited on a circuit formed on a substrate via an insulating film;
   a cathode electrode deposited on the organic EL layer;
   a groove formed along a direction of arrangement of pixels between the pixels in the insulating film; and
   a contact electrode that is provided at a bottom of the groove and receives a predetermined potential;
   an auxiliary electrode arranged on a side wall of the groove and directly electrically connecting the cathode electrode and the contact electrode, wherein
   the cathode electrode is electrically connected to the contact electrode in the groove.

2. The display device according to claim 1, wherein
   a drive circuit of a light-emitting unit including the organic EL layer is formed on a semiconductor substrate.

3. An electronic apparatus including a display device according to claim 1.

4. The electronic apparatus according to claim 3, wherein
   a drive circuit of a light-emitting unit including the organic EL layer is formed on a semiconductor substrate.

5. The display device according to claim 1, wherein the auxiliary electrode extends from a first end to a second end opposite the first end, the first end contacting the contact electrode and the second end contacting the sidewall of the groove.

* * * * *